(12) United States Patent
Komatsu

(10) Patent No.: US 6,363,027 B1
(45) Date of Patent: Mar. 26, 2002

(54) SEMICONDUCTOR MEMORY DEVICE

(75) Inventor: Noriaki Komatsu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/714,301

(22) Filed: Nov. 16, 2000

(30) Foreign Application Priority Data

Nov. 16, 1999 (JP) .......................................... 11-326099

(51) Int. Cl.⁷ ................................................ G11C 5/06
(52) U.S. Cl. ...................... 365/230.03; 365/63; 365/210
(58) Field of Search ............................. 365/230.03, 51, 365/63, 210

(56) References Cited

U.S. PATENT DOCUMENTS

| | | | | |
|---|---|---|---|---|
| 5,734,602 A | * | 3/1998 | Guritz et al. ................ | 365/104 |
| 5,815,428 A | * | 9/1998 | Tsuruda et al. ............... | 365/63 |
| 5,822,248 A | * | 10/1998 | Satori et al. ............ | 365/185.21 |
| 6,185,131 B1 | * | 2/2001 | Kouchi .................... | 365/185.2 |
| 6,188,608 B1 | * | 2/2001 | Maruyama et al. ......... | 365/210 |

* cited by examiner

Primary Examiner—Son T. Dinh

(57) ABSTRACT

A semiconductor memory device comprises a plurality of first memory cells each located at an intersection of each of a plurality of word lines and an associated one of a plurality of bit lines and each having one end connected to the associated bit line; a plurality of memory cell blocks each comprising first memory cells; dummy cell blocks, provided among the memory cell blocks, for electrically isolating those memory cell blocks which are located at both ends from each other, each of the dummy cell blocks comprising second memory cells; main bit lines each provided for each of the memory cell blocks and each of the dummy cell blocks and each connected to an associated one of the bit lines; a main-bit-line control section for performing such control as to apply a predetermined voltage to the main bit lines, connect the main bit lines to associated sense amplifiers or set the main bit lines in an open state based on an address signal; virtual ground lines connected to other terminals of the first memory cells and the second memory cells; main virtual ground lines each provided for each of the memory cell blocks and each of the dummy cell blocks and each connected to an associated one of the virtual ground lines; and a main-virtual-ground-line control section for performing such control as to apply a predetermined voltage to the main virtual ground lines or set the main virtual ground lines in an open state based on an address signal.

9 Claims, 15 Drawing Sheets

FIG. 4

|     | 0 | 1 | 2 | 3 | 4 | 5 | 6 | 7 |
|-----|---|---|---|---|---|---|---|---|
| CT0 | 0 | 1 | 0 | 1 | 0 | 1 | 0 | 1 |
| CT1 | 0 | 0 | 1 | 1 | 0 | 0 | 1 | 1 |
| CT2 | 0 | 0 | 0 | 1 | 1 | 1 | 1 | 1 |
| BD0 | 1 | 0 | 0 | 0 | 0 | 0 | 0 | 0 |
| BD1 | 0 | 1 | 0 | 0 | 0 | 0 | 0 | 0 |
| BD2 | 0 | 0 | 1 | 0 | 0 | 0 | 0 | 0 |
| BD3 | 0 | 0 | 0 | 1 | 0 | 0 | 0 | 0 |
| BD4 | 0 | 0 | 0 | 0 | 1 | 0 | 0 | 0 |
| BD5 | 0 | 0 | 0 | 0 | 0 | 1 | 0 | 0 |
| BD6 | 0 | 0 | 0 | 0 | 0 | 0 | 1 | 0 |
| BD7 | 0 | 0 | 0 | 0 | 0 | 0 | 0 | 1 |

# SEMICONDUCTOR MEMORY DEVICE

BACKGROUND OF THE INVENTION

1. Field of the Invention

The present invention relates to a semiconductor memory device so designed as to decrease power consumed at the time of reading data from memory cells.

2. Description of the Related Art

In general, each transistor in a semiconductor memory device such as a ROM (Read Only Memory) can store binary information, such as "0" or "1", or multi-value information which is expressed by the level of the gate voltage for turning on or off the transistor by controlling the threshold value.

The semiconductor memory device has transistors for a plurality of memory cells formed in rows and columns on a semiconductor substrate. The transistors for memory cells have gates connected to word lines formed in the row direction and drains connected to bit lines formed in the column direction.

In reading data stored in the memory cells in this semiconductor memory device, a memory cell corresponding to an input address signal is selected by a word line and a bit line which are enabled by a decoder. As the amount of the current that flows in the transistor of the selected memory cell is compared with the amount of the current that flows in a reference memory cell, data stored in the memory cell corresponding to the input address signal is read out.

In the aforementioned semiconductor memory device, each of the transistors for memory cells (hereinafter simply referred to as "memory-cell transistors") is formed on the semiconductor substrate independently of other memory-cell transistors by a device isolation film. The drains of memory-cell transistors are connected to the associated bit lines and the sources are grounded.

While a circuit in the aforementioned semiconductor memory device, which is necessary for data reading, takes a simple structure, however, a contact for connecting a diffusion layer which forms the drain of each memory-cell transistor and the associated bit line should be formed on that diffusion layer. To form the contact in the diffusion layer of the drain, therefore, another contact should be formed, thus requiring a larger area for the diffusion layer than actually needed as a constituting element of the transistor. In other words, the structure of those memory-cell transistors stands in the way of increasing the integration level of memory cells.

As a solution to the aforementioned shortcoming of the memory-cell transistors, a virtual ground type structure and layout have been employed for memory-cell transistors in order to improve the integration level of memory cells.

Specifically, the drains and sources of memory-cell transistors adjoining in the row direction are formed by a common diffusion layer and a plurality of diffusion layers are connected in the column direction (by sub bit lines and sub virtual ground lines) so that the diffusion layers are connected in a matrix form. This makes it unnecessary to provide a contact in an area where each memory cell is to be formed. This structure can improve the integration level of memory-cell transistors as compared with the structure that needs such a contact.

To increase the reading speed of this virtual ground type semiconductor memory circuit, burst reading is carried out to read out stored data. At this time, the reading speed is improved by continuously reading multiple bits by single address setting.

Depending on the structure of a circuit in which a semiconductor memory circuit is used, however, the number of burst bytes (bits) to be read out by single address setting may vary. In this respect, a semiconductor memory circuit is so constructed as to be able to select plural types of bit quantities in burst reading.

A conventional semiconductor memory device which employs the aforementioned virtual ground type transistor structure for memory cells will now be described with reference to FIGS. 1 and 2. FIGS. 1 and 2 are block diagrams showing the structure of the aforementioned virtual ground type semiconductor memory device. In this example, the number of burst reading bits selectable is either 4 bits or 8 bits.

In FIGS. 1 and 2, data is stored in memory-cell transistors which constitute each of 16 cell plates (memory cell plates 16A0 to 16A15) of a memory cell area 16A. Each cell plate is separated into two areas corresponding to two output terminals; for example, the cell plate 16A0 is separated into two areas corresponding to an output terminal T00 and an output terminal T01.

That is, the cell plate 16A0 is separated into cell areas that store data to be respectively output from the output terminals T00 and T01. Likewise, the cell plate 16A1 is separated into cell areas that store data to be respectively output from output terminals T02 and T03. Likewise, each of the remaining cell plates 16A2 to 16A15 is separated into cell areas corresponding to output terminals T04 and T05, or output terminals T030 and T031.

In reading data from the aforementioned cell area of the semiconductor memory device, switching the burst output between 8 bits and 4 bits is determined how deep the cache or buffer is provided in the circuit that uses this semiconductor memory device. This bit switching is set by a control signal CSB, control signal RASB, control signal CASB and an address signal AD0 when the semiconductor memory device is used. The following will discuss this bit switching step by step.

A control signal buffer 29 shapes the waveform of an input clock enable signal CKE and changes the voltage level thereof, and outputs the resultant signal as a control signal CK to a clock control circuit 30. Likewise, the control signal buffer 29 shapes the waveform of an input clock signal CLK and changes the voltage level thereof, and outputs the resultant signal as a clock signal CL to the clock control circuit 30.

The clock control circuit 30 sends the input control clock signal CL to a counter 18 when the input control signal CK has an "H" level and does not send the input clock signal CL to the counter 18 when the input control signal CK has an "L" level.

Further, the control signal buffer 129 shapes the waveform of the input control signal CSB and changes the voltage level thereof, and outputs the resultant signal as a control signal CSBI to an instruction decoder 28. Likewise, the control signal buffer 29 shapes the waveform of the input clock signal RASB and changes the voltage level thereof, shapes the waveform of the input control signal CASB and changes the voltage level thereof, shapes the waveform of the input control signal MRB and changes the voltage level thereof, and outputs the resultant signals as control signals RASBI, CASBI and MRBI to the instruction decoder 28, respectively.

The instruction decoder 28 sends a control signal MRSB2 as an L-level signal to a switch circuit 14 when the control signals CSBI, RASBI, CASBI and MRBI all become an "L" level.

The switch circuit 14 sets the number of burst output bits (per one output terminal) based on the address signal AD0 and an address signal AD1 when the control signal MRSB2 input has an "L" level.

Specifically, in the case where the control signal MRSB2 input has an "L" level, the switch circuit 14 outputs a control signal MDBL8 with an "H" level to set the number of burst output bits to 8 bits when the address signal AD0 has an "L" level and the address signal AD1 has an "H" level, and outputs the control signal MDBL8 with an "L" level to set the number of burst output bits to 4 bits when the address signal AD0 has an "H" level and the address signal AD1 has an "L" level. Accordingly, the switch circuit 14 sets the number of bits sequentially output from each output terminal in the burst reading.

To specify memory-cell transistors in each of the cell plates 16A0 to 16A15 in the memory cell area 16A and read data stored in those memory-cell transistors from output terminals TO0 to TO31, for example, addresses AD0 to AD12 are input from an external CPU (Central Processing Unit) or the like.

Addresses buffer 11 shapes the waveforms of address signals AD0–AD12 and sends the resultant address signals AD0–AD12 to an address latch 12.

The address latch 12 stores the address signals AD0–AD12 input from the address buffer 11 as row address signals AD0AT, AD1AT, and AD12AT at the timing when the control signal CSB and the control signal RASB both become an "L" level.

The address latch 12 sends the stored row address signals AD0AT–AD12AT to an X decoder 13, the row address signals AD0AT and AD1AT to the switch circuit 14, the row address signal AD0AT to a VG decoder 15, and the row address signal AD0AT to a Y decoder 17.

The address latch 12 stores the address signals AD0–AD7 input from the address buffer 11 as column address signals AD0RT, AD1RT, . . . , and AD7RT at the timing when the control signal CSB and the control signal CASB both become an "L" level.

The address latch 12 sends the stored column address signals AD4RT–AD7RT to the VG decoder 15, the column address signals AD4RT, AD6RT and AD7RT to the Y decoder 17, the column address signal AD0RT–AD2RT to the counter 18 the column address signal AD2RT and AD3RT to a Y2 decoder 19, the column address signal AD4RT–AD6RT to a bank decoder 20, and the column address signal AD4RT–AD7RT to a VGPG decoder 21.

The X decoder 13 generates word line select signals corresponding to word lines WD0–WD4095 based on the row address signals AD1AT–AD12AT and sends those signals to the gates of the associated memory-cell transistors in the memory cell area 16A which are respectively connected to the word lines WD0–WD4095.

Based on the input row address signal AD0AT and column address signals AD4RT–AD7RT, the VG decoder 15 sends virtual ground control signals VG00 to VG03 to a VG selector 26A.

The Y decoder 17 generates Y selector control signals Y00 to Y07 based on the row address signal AD0AT and the column address signals AD4RT, AD6RT and AD7RT and sends those control signals to a Y selector circuit 22A.

The Y2 decoder 19 generates Y selector control signals Y20 to Y23 based on the column address signals AD2RT and AD3RT and sends those control signals to the Y selector circuit 22A.

Based on the column address signals AD4RT–AD7RT, the VGPG decoder 21 sends virtual ground control signals VG10 and VG11 and a precharge control signal PG1 to a precharge circuit 27A.

For example, the X decoder 13 decodes the row address signals AD1AT–AD12AT output from the address latch 12 and selects and enables one of the word lines WD0–WD4095. Accordingly, the memory-cell transistors in the row direction of each of the cell plates 16A0–16A15 in the memory cell area 16A are selected simultaneously to be ready for reading data.

Based on the individual control signals generated by the aforementioned Y decoder 17, Y2 decoder 19, bank decoder 20, VG decoder 15 and VGPG decoder 21, data is read out as illustrated in FIG. 3 for each of the output terminals TO0–TO31. FIG. 3 is a block diagram showing the structures of the Y selector circuit 22A, a sense amplifier circuit 23A and a latch circuit 24 per one output terminal of the semiconductor memory device, for example, a Y selector section 40A, a Y2 selector section 50, a sense amplifier section 60 and a latch section 70 which correspond to the output terminal TO0.

In this diagram, based on the input Y selector control signals Y00–Y07, Y10 and Y11, and precharge control signals P0 and P1, the Y selector section 40A selects an associated one of eight main bit lines for outputting data from the associated memory-cell transistors in the cell plate 16A0 and connects the selected main bit line to the associated data line.

Specifically, there are eight main bit lines corresponding to each of data lines D0A, D0B, D1A, D1B, D2A, D2B, D3A, D3B, D4A, D4B, D5A, D5B, D6A, D6B, D7A and D7B, and one of the eight main bit lines is selected by the Y selector section 40A to read data stored in the associated memory-cell transistors.

The Y2 selector section 50 comprises transistors M0A, M0B, M1A, M1B, M2A, M2B, M3A, M3B, M4A, M4B, M5A, M5B, M6A, M6B, M7A and M7B, which are, for example, n channel MOS transistors.

Based on the Y selector control signals Y20 and Y22 input from the Y2 decoder 19, the Y2 selector section 50 sends data on either the data line D0A or the data line D0B to a sense amplifier SA0 in the sense amplifier section 60.

Specifically, when the Y selector control signal Y20 has an "H" level and the Y selector control signal Y22 has an "L" level, the transistor M0A in the Y2 selector section 50 is turned on and the transistor M0B is turned off, so that data on the data line D0A is sent to the sense amplifier SA0.

When the Y selector control signal Y20 has an "L" level and the Y selector control signal Y22 has an "H" level, on the other hand, the transistor M0A in the Y2 selector section 50 is turned off and the transistor M0B is turned on, so that data on the data line D0B is sent to the sense amplifier SA0.

Likewise, based on the Y selector control signals Y20 and Y22 input from the Y2 decoder 19, the Y2 selector section 50 sends data on either the data line D1A or the data line D1B to a sense amplifier SA1 in the sense amplifier section 60, sends data on either the data line D2A or the data line D2B to a sense amplifier SA2 and sends data on either the data line D3A or the data line D3B to a sense amplifier SA3.

Based on the Y selector control signals Y21 and Y23 input from the Y2 decoder 19, the Y2 selector section 50 sends data on either the data line D4A or the data line D4B to a sense amplifier SA4 in the sense amplifier section 60.

Specifically, when the Y selector control signal Y21 has an "H" level and the Y selector control signal Y23 has an "L"

level, the transistor M4A in the Y2 selector section 50 is turned on and the transistor M4B is turned off, so that data on the data line D4A is sent to the sense amplifier SA4.

When the Y selector control signal Y21 has an "L" level and the Y selector control signal Y23 has an "H" level, on the other hand, the transistor M4A in the Y2 selector section 50 is turned off and the transistor M4B is turned on, so that data on the data line D4B is sent to the sense amplifier SA4.

Likewise, based on the Y selector control signals Y21 and Y23 input from the Y2 decoder 19, the Y2 selector section 50 sends data on either the data line D5A or the data line D5B to a sense amplifier SA5 in the sense amplifier section 60, sends data on either the data line D6A or the data line D6B to a sense amplifier SA6 and sends data on either the data line D7A or the data line D7B to a sense amplifier SA7.

The sense amplifier section 60 comprises the sense amplifiers SA0, SA1, SA2, SA3, SA4, SA5, SA6 and SA7.

The sense amplifier SA0 determines whether data stored in each memory-cell transistor is "0" or "1" by comparing data on the selected one of the data lines D0A and D0B with the reference potential of a reference signal RG from a reference cell 35, and sends the determination result to a latch 71 in the latch section 70.

Likewise, each of the sense amplifiers SA1 to SA7 determines whether data stored in each memory-cell transistor is "0" or "1" by comparing data input through the transistor connected to that sense amplifier with the reference potential of the reference signal RG from the reference cell 35 (FIG. 2), and sends the determination result to an associated one of latches 72 to 78 in the latch section 70.

The latches 71–78 holds data on the determination results input from the associated sense amplifiers SA0–SA7 based on a latch signal input at a predetermined timing.

When the number of burst readout bits set in the switch circuit 14 (FIGS. 1 and 2) is "8", the sense amplifiers SA0–SA7 are enabled by sense amplifier enable signals SAEB20 and SAEB21 supplied from a delay circuit 31A (FIGS. 1 and 2), and data on the results of determination made by the sense amplifiers SA0–SA7 are sent to the associated latches 71–78.

When the number of burst readout bits set in the switch circuit 14 (FIGS. 1 and 2) is "4", on the other hand, either a group of the sense amplifiers SA0–SA3 or a group of the sense amplifiers SA4–SA7 are enabled based on an address signal by the sense amplifier enable signals SAEB20 and SAEB21 supplied from the delay circuit 31A (FIGS. 1 and 2), and data on the results of determination made by the sense amplifiers SA0–SA3 or data on the results of determination made by the sense amplifiers SA4–SA7 are sent to the associated latches 71–74 or the associated latches 75–78. That is, when the number of burst bits (burst length) is "4", half the sense amplifiers that are not used are not enabled, thus reducing consumed power.

The latches 71–78 send the held data to a burst selector 79. When the burst length is 8 bits, the burst selector 79 sends the data input from the latches 71–78 to the output terminal TO0 in order from the latch 71 based on select signals BD0 to BD7 supplied from the burst decoder 29 (FIGS. 1 and 2).

When the burst length is 4 bits, on the other hand, the burst selector 79 sends either the data input from the latches 71–74 or the data input from the latches 75–78 to the output terminal TO0 in order based on the select signals BD0–BD7 supplied from the burst decoder 29 (FIGS. 1 and 2).

In FIGS. 1 and 2, the counter 18 performs counting based on the values of data of the column address signals AD0RT–AD2RT supplied from the address latch 12 for each input of the clock signal CL.

Further, the counter 18 performs counting between "0" to "7" when the control signal MDBL8 has an "H" level (in the case of the burst output of 8 bits), i.e., the counter 18 performs counting of the count value of {count signal CT2, count signal CT1, count signal CT0} from {0, 0, 0} to {1, 1, 1} for each input of the clock signal CL.

Furthermore, the counter 18 performs counting between "0" to "3" when the control signal MDBL8 has an "L" level and the column address signal AD2RT has an "L" level (in the case of the burst output of 4 bits), i.e., the counter 18 performs counting of the count value of {count signal CT2, count signal CT1, count signal CT0} from {0, 0, 0} to {0, 1, 1}. When the column address signal AD2RT has an "H" level, the counter 18 performs counting between "4" to "7", i.e., the counter 18 performs counting of the count value of {count signal CT2, count signal CT1, count signal CT0} from {1, 0, 0} to {1, 1, 1}.

A burst decoder 29 outputs the select signals BD0–BD7 in accordance with the count value {count signal CT2, count signal CT1, count signal CT0} based on a truth table shown in FIG. 4. Specifically, the burst decoder 29 outputs a select signal {0, 0, 0, 0, 0, 0, 0, 1} as a select signal {select signal BD7, select signal BD6, select signal BD5, select signal BD4, select signal BD3, select signal BD2, select signal BD1, select signal BD0} when the count value is {0, 0, 0}, and outputs a select signal {1, 0, 0, 0, 0, 0, 0, 1} when the count value is {1, 1, 1}.

Accordingly, as mentioned above, the burst selector 79 in the latch circuit 24 is controlled to either the case where the burst output is 8 bits or the case where the burst output is 4 bits for each of the output terminals TO0–TO31 by the aforementioned select signal {select signal BD7, select signal BD6, select signal BD5, select signal BD4, select signal BD3, select signal BD2, select signal BD1, select signal BD0} based on the count value {count signal CT2, count signal CT1, count signal CT0} output from the counter 18.

Specifically, with the burst length being 8 bits, for example, when the select signal {0, 0, 0, 0, 0, 0, 0, 1} to the select signal {1, 0, 0, 0, 0, 0, 0, 0} are input from the burst decoder 29 (FIGS. 1 and 2) in FIG. 4, the burst selector 79 outputs the data stored in the latch 71 to the output terminal TO0 in the case of the select signal {0, 0, 0, 0, 0, 0, 0, 1} and sequentially outputs the data stored in the latches 71–78 to the output terminal TO0 in the burst length of 8 bits every time the select signal {select signal BD7, select signal BD6, select signal BD5, select signal BD4, select signal BD3, select signal BD2 select signal BD1, select signal BD0} is changed.

With the burst length being 4 bits, on the other hand, when the select signal {0, 0, 0, 0, 0, 0, 0, 1} to the select signal {0, 0, 0, 0, 1, 0, 0, 0} or the select signal {0, 0, 0, 1, 0, 0, 0,} to the select signal {1, 0, 0, 0, 0, 0, 0,0} are input from the burst decoder 29 (FIGS. 1 and 2), the burst selector 79 outputs the data stored in the latch 71 to the output terminal TO0 in the case of the select signal {0, 0, 0, 0, 0, 0, 0, 1} and sequentially outputs the data stored in the latches 71–78 to the output terminal TO0 in the burst length of 4 bits every time the select signal {select signal BD7, select signal BD6, select signal BD5, select signal BD4, select signal BD3, select signal BD2, select signal BD1, select signal BD0} is changed.

As described above, the burst length of 4 bits and the burst length of 8 bits are switched from one to the other, and in the case of the burst length of 4 bits, the sense amplifiers for the four bits which are not used are not enabled, thus reducing the power consumed accordingly.

To prevent the current from flowing in those memory-cell transistors which are not selected at the time of data reading data stored in memory-cell transistors, and thus prevents erroneous reading, however, the conventional virtual ground type semiconductor memory device is provided with the precharge circuit that prevents the current from flowing in the unselected memory-cell transistors.

To set the associated sub bit lines and sub virtual ground lines connected to the memory-cell transistors to a predetermined voltage at which the current does not flow, therefore, the sub bit lines and sub virtual ground lines should be precharged by this precharge circuit in the conventional semiconductor memory device.

This precharge current inevitably becomes large due to many memory-cell transistors connected. In the case where the burst length is 4 bits, therefore, simple disabling of the remaining four bits of each sense amplifier is insufficient to reduce the consumed power. In this case, to ensure the intended reduction of the consumed power, it is necessary to inhibit precharging of sub bit lines and sub virtual ground lines which are connected to the remaining half of the memory-cell transistors of the semiconductor memory device and are not to be accessed.

With the structure of the conventional semiconductor memory device, however, when unnecessary individual bit lines and unnecessary individual virtual ground lines are not precharged, the current flows through those memory-cell transistors which are not selected. This shortcoming will be discussed below briefly.

The data reading operation of the semiconductor memory device will be described with reference to FIGS. 12 through 15.

FIG. 12 is a conceptual diagram showing the relationship between a block BK4 which is an extracted portion of the precharge circuit 27A, VG selector 26A, cell plate 16A0, Y selector section 40A and Y2 selector section 50 that correspond to the sense amplifier SA3 in FIG. 3 and a block BK5 which is an extracted portion of the precharge circuit 27A, VG selector 26A, cell plate 16A0, Y selector section 40A and Y2 selector section 50 that correspond to the sense amplifier SA4. FIG. 13 is a block diagram showing the structure of the block BK4 in FIG. 12, and FIG. 14 is a block diagram showing the structure of the block BK5 in FIG. 12.

FIG. 15 is a block diagram showing the structure of an area Q in FIG. 12 which is extracted from the cell plate 16A0 and is the peripheral portion of a single bank block of word lines WD0–WD63 in the word lines WD0–WD4095. In an area C1 in FIG. 15 are formed memory-cell transistors which are similar to memory-cell transistors MSA0 to MSA7.

A description of the structure and operation of those other than the associated transistors and signal lines will not be given below.

Suppose that with the burst length of 8 bits, an address signal is input which selects the memory-cell transistor MSA0 as holding data to be read out to the sense amplifier SA3. At the same time, an unillustrated memory-cell transistor which is at the location corresponding to the memory-cell transistor MSA0 is selected as holding data to be read out to the sense amplifier SA4, and data is output to the sense amplifier SA4 in a process similar to what will be explained below. The following will discuss the flow of data to be read out to the sense amplifier SA3. At this time, the word line WD0 is enabled ("H" level) by the X decoder 13 (FIGS. 1 and 2).

Data is stored in each memory-cell transistor by changing the threshold voltage that controls the ON/OFF action of that transistor. That is, when each memory-cell transistor is turned on as the word line that is connected to the gate of that memory-cell transistor is enabled by changing the threshold voltage, the current that corresponding to the threshold voltage flows through the memory-cell transistor, thus causing the transistor to store data. In the case of binary data, two threshold values respectively for the state where the current is hard to flow and the state where the current is easy to flow are to be controlled.

To permit the read current from a main bit line D314 to flow only through the memory-cell transistor MSA0 to be selected, therefore, it is necessary to set a main bit line D313 in an open state (high-impedance state), a main virtual ground line VG37 at the ground potential (GND level), a main bit line D315 at a predetermined potential (precharge potential), a main bit line D40 in an open state, a main virtual ground line VG40 at the precharge potential and a main bit line D41 in an open state.

At this time, to read data on the main bit line D314 to the sense amplifier SA3, the Y selector control signals Y20 and Y21 are set to an "L" level and the Y selector control signals Y22 and Y23 are set to an "H" level. Note that the transistors M3A, M4A, M3B and M4B are n channel transistors.

Accordingly, the transistors M3B and M4B are turned on and the transistors M3A and M4A are turned off.

Further, the precharge signal P0 and Y selector controls signals Y11 become an "L" level and the precharge signal P1 and Y selector control signal Y10 become an "H" level. Note that the transistors MA10, MA11, MA0, MA1, MB10, MB11, MB0 and MB1 are n channel transistors.

Accordingly, the transistors MA10, MA1, MB10 and MB1 are turned on and the transistors MA11, MA0, MB11 and MB0 are turned off.

Further, the Y decoder 17 (FIGS. 1 and 2) sets the Y selector control signals Y00 to Y05 to an "L" level and sets the Y selector control signals Y06 and Y07 to an "H" level. Note that the transistors M200 to M207 and M210 to M217 in the Y selector section 40A are n channel MOS transistors.

Accordingly, the transistors M206, M207, M216 and M217 are turned on and the transistors M200–M205 and M210–M215 are turned off.

Further, the virtual ground control signal VG10 and the precharge control signal PG1 are at an "L" level and the virtual ground control signal VG11 and the precharge control signal PG0 are at an "H" level. Note that the transistors MA50, MA51, MA60, MA61, MB50, MB51, MB60 and MB61 in the precharge circuit 27A are n channel MOS transistors.

Accordingly, the transistors MA51, MA60, MB51 and MB60 are turned on and the transistors MA50, MA61, MB50 and MB61 are turned off.

Furthermore, the virtual ground control signals VG00 and VG03 become an "H" level and the virtual ground control signals VG01 and VG02 become an "L" level. Note that the transistors MA70 to MA73 and MB70 to MB73 are n channel MOS transistors.

Accordingly, the transistors MA70, MA73, MB70 and MB73 in the VG selector 26A are turned off and the transistors MA71, MA72, MB71 and MB72 are turned on.

Under the above-described control of the individual transistors, in the semiconductor memory device, the main bit line D314 is set at a predetermined read potential, the main bit line D313 is set to an open state (high-impedance state), the main virtual ground line VG37 is set at the ground potential (GND level), the main bit line D315 is set at a predetermined potential (precharge potential), the main bit line D40 is set in an open state, the main virtual ground line VG40 is set at the precharge potential, and the main bit line D41 is set in an open state.

Then, a select signal BSD0 to be input to a bank selector 80A from the bank decoder 20 becomes an "L" level, a select signal BSD1 becomes an "H" level, a select signal BSG0 becomes an "H" level, and select signals BSG1 to BSG3 become an "L" level. Note that transistors M100 to M111 and M120 to M131 in the bank selector 80A are n channel MOS transistors.

Accordingly, the transistors M100, M102, M104, M106, M108, M110, M120, M124 and M128 are turned on and the transistors M101, M103, M105, M107, M109, M111, M121–M123, M125–M127 and M129–M131 are turned off.

As a result of the above, a sub bit line B314a, which is connected via the transistor M104 to the main bit line D314 connected to the sense amplifier SA3, and a sub virtual ground line G37a, which is connected via the transistor M124 to the main virtual ground line VG37 connected to the ground line, are connected to the memory-cell transistor MSA0, so that the current flows from the sense amplifier SA3 to the main virtual ground line VG37 via the memory-cell transistor MSA0.

The sense amplifier SA3 compares the value of the current that flows across the main bit line D314 with the current value of the reference signal RG input from the reference cell 35. When the value of the current flowing across the main bit line D314 is larger than the current value of the reference signal RG, for example, the threshold value is low and the memory-cell transistor is on, so that the current is flowing through the memory-cell transistor. Therefore, the sense amplifier SA3 determines that data stored in the memory-cell transistor is "L".

When the value of the current flowing across the main bit line D314 is smaller than the current value of the reference signal RG, on the other hand, the threshold value is high and the memory-cell transistor is off, so that the current is not flowing through the memory-cell transistor. Therefore, the sense amplifier SA3 determines that data stored in the memory-cell transistor is "H".

The reference cell 35 is constructed by a circuit which outputs the reference signal RG whose current value is, for example, an intermediate value between the voltage level of a bit signal in the case where data stored in memory-cell transistors in the memory cell section 16A is "H" and the voltage level of a bit signal in the case where data stored in memory-cell transistors is "L".

The reference cell 35 may be constructed by a reference transistor which outputs the reference signal RG whose current value is determined by the current flowing across a selected word line and is controlled to a threshold value that becomes an intermediate voltage level between the voltage level of a bit signal in the case where data stored in the memory-cell transistors is "H" and the voltage level of a bit signal in the case where data stored in memory-cell transistors is "L".

Even if the memory-cell transistors on the left-hand side of the memory-cell transistor MSA0 in FIG. 15 has a low threshold voltage and is in such a state where the current easily flows at this time, the associated main bit lines D312 and D313 and the main virtual ground line VG36 are in an open state so that the currents from the memory-cell transistors on the left side to the memory-cell transistor MSA0 do not adversely affect the current that flows across the sub virtual ground line G37a. That is, the amount of the current flowing toward the sub virtual ground line G37a via the memory-cell transistor MSA0 is inhibited from being restricted by the current that flows toward the sub virtual ground line G37a from the other memory-cell transistors on the left side to the memory-cell transistor MSA0, thus preventing erroneous reading.

Even if the memory-cell transistors MSA1–MSA7 on the right-hand side of the memory-cell transistor MSA0 have low threshold voltages and are in such a state where the current easily flows, the associated main bit line D315 and the main virtual ground line VG40 are at the precharge potential. This prevents the current from flowing toward the other memory-cell transistors, including the memory-cell transistors MSA1–MSA7, than the selected one.

Accordingly, when the threshold value of the memory-cell transistor MSA0 is high, the current from the sense amplifier does not flow across the sub virtual ground line G337a. If the sub virtual ground line G337a is not precharged, however, the current flows toward the other memory-cell transistors, including the memory-cell transistors MSA1–MSA7, than the selected one. Therefore, the current flows across the main bit line D315 so that the sense amplifier SA3 makes a similar decision to the one in the case where the current flows in the memory-cell transistor MSA0 and thus does erroneous reading. The precharge circuit therefore prevents such erroneous reading.

At this time, precharge circuits MP1 and MP2 precharge the associated main bit lines based on a precharge control signal PCM output from the delay circuit 31A at the timing at which the sense amplifier circuit 23A reads out data.

Likewise, precharge circuits SP1 and SP2 precharge the associated main virtual ground lines based on a precharge control signal PCS output from the delay circuit 31A at the timing at which the sense amplifier circuit 23A reads out data.

Referring to FIGS. 1 and 2, precharge control signals PCS20, PCS21, PCM20 and PCM21 are used in one embodiment of this invention and are not output from the delay circuit 31A in the prior art.

In the above-described case, in the case of the burst length of 4 bits as in the case of the burst length of 8 bits, precharging is performed on the main bit lines and main virtual ground lines which correspond to the memory-cell transistors that are not sensed by a sense amplifier.

With the burst length of 4 bits, in the case where data in the memory-cell transistors corresponding to the sense amplifiers SA0–SA3 are read out and data in the memory-cell transistors corresponding to the sense amplifiers SA4–SA7 are not read out, erroneous reading similar to the one described in the previous description of the case of the 8-bit burst length if precharging the main bit lines and main virtual ground lines which correspond to the sense amplifiers SA0–SA7 is stopped to reduce the consumed current.

SUMMARY OF THE INVENTION

Accordingly, it is an object of the present invention to provide a virtual ground type semiconductor memory device which, in the case of the burst length of 4 bits (in the case of changing the burst length), does not precharge the main bit lines and main virtual ground lines that correspond to those sense amplifiers which are not used, without causing erroneous reading, thus reducing the consumed power (consumed current) in a reading operation.

To achieve the above object, according to this invention, there is provided a semiconductor memory device which comprises a plurality of first memory cells each located at an intersection of each of a plurality of word lines and an associated one of a plurality of bit lines and each having one end connected to the associated bit line; a plurality of memory cell blocks each comprising a predetermined number of first memory cells in the plurality of the first memory cells; dummy cell blocks, provided among the memory cell blocks, for electrically isolating those memory cell blocks which are located at both ends from each other, each of the dummy cell blocks comprising second memory cells; main bit lines each provided for each of the memory cell blocks and each of the dummy cell blocks and each connected to an associated one of the bit lines; a main-bit-line control section for performing such control as to apply a predetermined voltage to the main bit lines, connect the main bit lines to associated sense amplifiers or set the main bit lines in an open state based on an address signal; virtual ground lines connected to other terminals of the first memory cells and the second memory cells; main virtual ground lines each provided for each of the memory cell blocks and each of the dummy cell blocks and each connected to an associated one of the virtual ground lines; and a main-virtual-ground-line control section for performing such control as to apply a predetermined voltage to the main virtual ground lines or set the main virtual ground lines in an open state based on an address signal.

According to a first preferable mode, in the semiconductor memory device, the second memory cells constituting the dummy cell blocks may be similar to the first memory cells in the memory cell blocks.

According to a second preferable mode, in the semiconductor memory device and the first preferable mode, each of the first memory cells may be comprised of an MOS transistor and may store data as a threshold voltage for controlling an ON/OFF state of the transistor is changed.

According to a third preferable mode, in the semiconductor memory device and the first and second preferable modes, a threshold voltage of MOS transistors constituting the second memory cells of the dummy cell blocks may be controlled to such a value that the MOS transistors are not turned on by a predetermined voltage to be applied to gates of the MOS transistors via the word lines.

According to a fourth preferable mode, in any of the semiconductor memory device and the first to third preferable modes, each of the bit lines may be connected to an associated one of the main bit lines via a first MOS transistor and each of the virtual ground lines may be connected to an associated one of the main virtual ground lines via a second MOS transistor.

According to a fifth preferable mode, in the fourth preferable mode, a threshold voltage of the first MOS transistors provided between the bit lines and the main bit lines in the dummy cell blocks may be controlled to such a value that the first MOS transistors are not turned on by a voltage of a predetermined control signal.

According to a sixth preferable mode, in the fourth or fifth preferable mode, a threshold voltage of the second MOS transistors provided between the virtual ground lines and the main virtual ground lines in the dummy cell blocks may be controlled to such a value that the second MOS transistors are not turned on by a voltage of a predetermined control signal.

According to a seventh preferable mode, the semiconductor memory device of any one of the fourth to sixth preferable modes may further comprise a memory-cell selection control section for performing ON/OFF control of the first MOS transistors and the second MOS transistors based on an input address signal to thereby select a memory cell corresponding to the address signal and control a direction of a current flowing in the memory cell in association with voltage states of the main bit lines and the main virtual ground lines.

According to an eighth preferable mode, in any of the above-described semiconductor memory devices, interconnection patterns of the main bit lines and the main virtual ground lines may be formed alternately.

BRIEF DESCRIPTION OF THE DRAWINGS

FIG. 4 is a truth table showing the correlation between count values to be input to a burst decoder 29 in FIG. 1 and values of select signals to be output therefrom;

DETAILED DESCRIPTION OF THE PREFERRED EMBODIMENT

Figure 1:
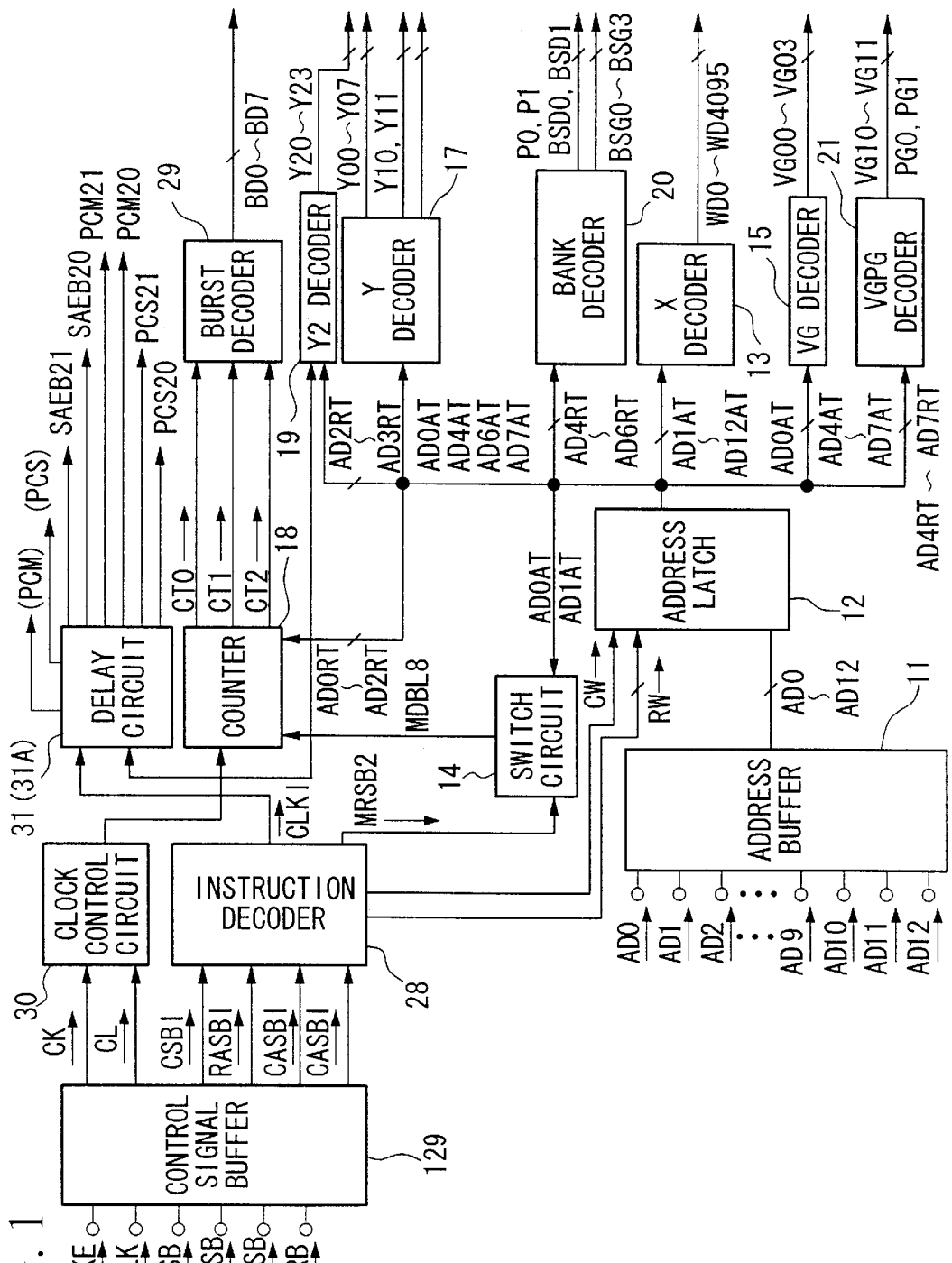
FIG. 1 is a block diagram illustrating the structure of a semiconductor memory device according to one embodiment of this invention.
Figure 2:
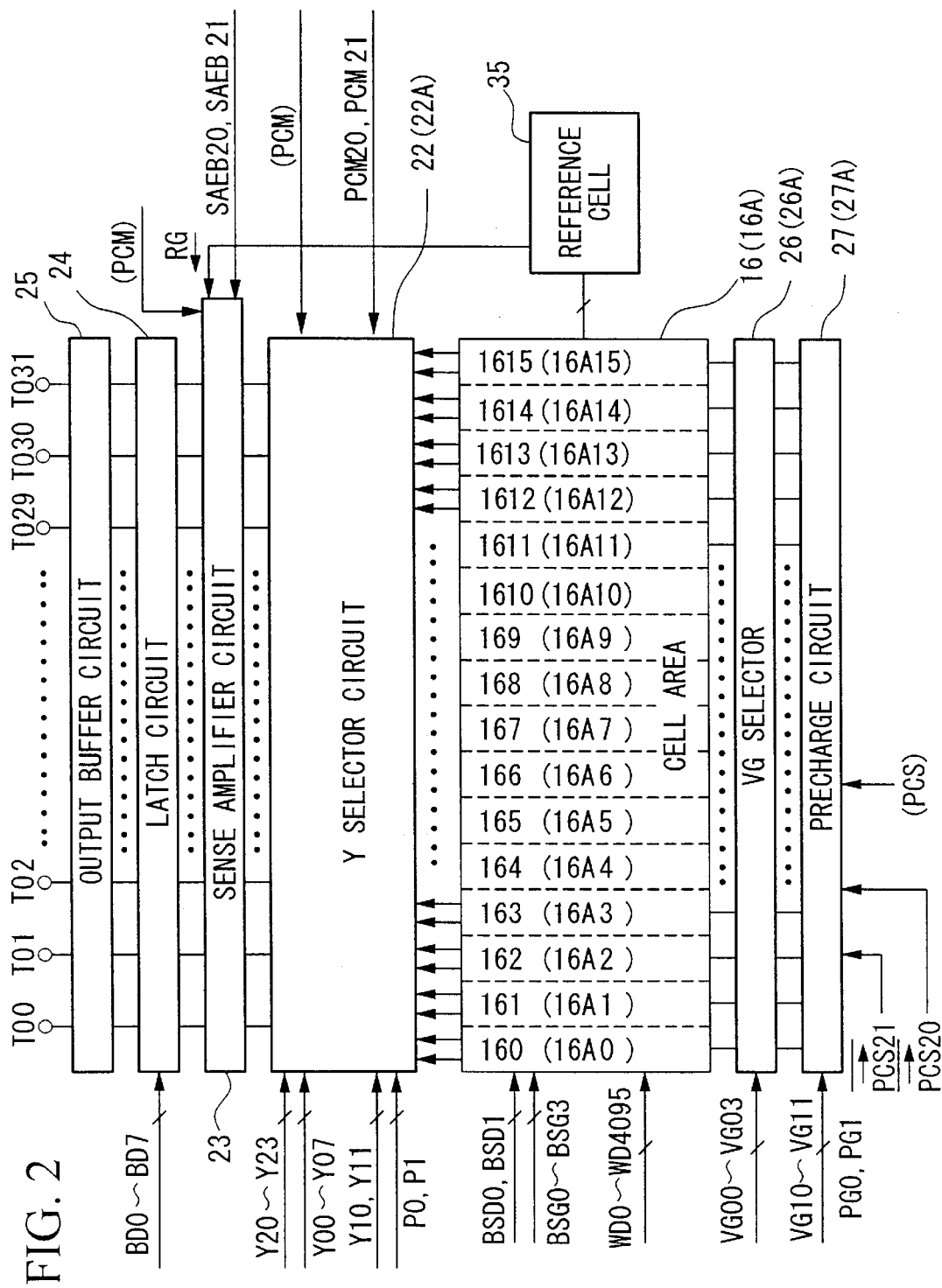
FIG. 2 is a block diagram illustrating the structure of the semiconductor memory device according to this embodiment.

A preferred embodiment of the present invention will now be described with reference to the accompanying drawings. FIGS. 1 and 2 are block diagrams illustrating the structure of a semiconductor memory device according to one embodiment of this invention. To avoid the redundant description, like or same reference numerals are given to those components of this semiconductor memory device which are the same components of the prior art that have already been described.

In FIGS. 1 and 2, data is stored in memory-cell transistors that constitute cell plates 160 to 1615 of a memory cell area 16. That is, data is stored in the memory-cell transistors that constitute each of the sixteen cell plates of the memory cell area 16. Each cell plate is separated into two areas corresponding to two output terminals; for example, the cell plate 160 is separated into two areas corresponding to an output terminal TO0 and an output terminal TO1.

That is, the cell plate 160 is separated into cell areas that store data to be respectively output from the output terminals TO0 and TO1. Likewise, the cell plate 161 is separated into cell areas that store data to be respectively output from output terminals TO2 and TO3. Likewise, each of the remaining cell plates 162 to 1615 is separated into cell areas corresponding to output terminals TO4 and TO5, or output terminals TO30 and TO31.

Data is stored in the memory-cell transistors that constituting the memory cell area 16 by changing, for each data to be stored, the threshold voltage which controls the ON/OFF state of each transistor. That is, data is stored in each memory-cell transistor by changing the threshold voltage of that transistor, so that when the word select line connected to the gate of this transistor is enabled, the current corresponding to the threshold voltage flows. The stored data is therefore determined by detecting the value of this current.

In the case where data to be stored has a binary value, for example, the threshold value of each memory-cell transistor is controlled to one of two kinds by the voltage to be supplied to the gate of the transistor over the word select line: whether the transistor is turned on to permit the current to flow it or the transistor is in an OFF state to inhibit the flow of the current.

To specify memory-cell transistors in each cell plate of the memory cell area 16 and read stored data from the memory-cell transistors, address signals AD0 to AD12 are input from an external CPU (Central Processing Unit) or the like when a control signal CSB becomes an "L" level and a control signal RASB becomes an "L"level, and the address signals AD0 to AD7 are input when the control signal CSB becomes an "L" level and a control signal CASB becomes an "L"level.

The control signal CSB is an enable signal to enable (make operable) the semiconductor memory device, the control signal RASB allows an address for a row address system to be fetched (word line selection) and the control signal CASB allows an address for a column address system to be fetched (bit line selection).

An address buffer 11 shapes the waveforms of the address signals AD0–AD12, adjusts their voltage levels, and sends the adjusted address signals AD0–AD12 to an address latch 12.

The address latch 12 stores the address signals AD0–AD12 input from the address buffer 11 as row address signals AD0AT, AD1AT, and AD12AT at the timing when a write signal RW is input from the address buffer 11.

The address latch 12 stores the address signals AD0–AD7 input from the address buffer 11 as row address signals AD0RT, AD1RT, and AD7RT at the timing when a write signal CW is input from an instruction decoder 28.

The instruction decoder 28 outputs the write signal RW to the address latch 12 when the input control signal CSBI has an "L" level and the input control signal RASBI has an "L" level and outputs the write signal CW to the address latch 12 when the input control signal CSBI has an "L" level and the input control signal CASBI has an "L" level.

A control signal buffer 129 shapes the waveform of a clock enable signal CKE to be input and changes its voltage level, and outputs the resultant signal as a control signal CK to a clock control circuit 30. Likewise, the control signal buffer 29 shapes the waveform of an input clock signal CLK and changes its voltage level, and outputs the resultant signal as a clock signal CL to the clock control circuit 30.

Further, the control signal buffer 129 shapes the waveform of the input clock signal CSB and changes its voltage level with the same polarity, and outputs the resultant signal as the control signal CSBI to the instruction decoder 28. The control signal buffer 29 also shapes the waveform of the input clock signal RASB and changes its voltage level with the same polarity, and outputs the resultant signal as the control signal RASBI to the instruction decoder 28. Likewise, the control signal buffer 29 shapes the waveform of the input clock signal CASB and changes its voltage level with the same polarity, and outputs the resultant signal as the control signal CASBI to the instruction decoder 28. Furthermore, the control signal buffer 129 shapes the waveform of an input clock signal MRB and changes its voltage level, and outputs the resultant signal as a control signal MRBI to the instruction decoder 28.

The address latch 12 sends the stored row address signals AD1AT–AD12AT to an X decoder 13, the row address signals AD0AT and AD1AT to the switch circuit 14, the row address signal AD0AT to a VG decoder 15, and the row address signal AD0AT to a Y decoder 17 at the input timing of the write signal RW.

The address latch 12 sends the stored column address signals AD4RT–AD7RT to the VG decoder 15, the column address signals AD4RT, AD6RT and AD7RT to the Y decoder 17, the column address signal AD0RT–AD2RT to a counter 18, the column address signal AD2RT and AD3RT to a Y2 decoder 19, the column address signal AD4RT–AD6RT to a bank decoder 20, and the column address signal AD4RT–AD7RT to a VGPG decoder 21 at the input timing of the write signal CW.

In reading data from the memory-cell transistors of the aforementioned memory cell area 16 of the semiconductor memory device based on the aforementioned address signals AD0AT–AD12AT, and the column address signal AD0RT–AD7RT, switching the burst output between 8 bits and 4 bits is determined by how deep the cache or buffer is provided in the circuit that uses this semiconductor memory device. This bit switching is therefore set by the control signal CSB, control signal RASB, control signal CASB and the address signal AD0 when the semiconductor memory device is used.

The instruction decoder 28 sends a control signal MRSB2 as an L-level signal to a switch circuit 14 when the control signals RASBI, CASBI and MRBI all become an "L" level with the control signal CSBI having an "L" level.

The switch circuit 14 sets the number of burst output bits based on the address signal AD0 and the address signal AD1 when the input control signal MRSB2 input has an "L" level.

In the case where the control signal MRSB2 input has an "L" level, the switch circuit 14 outputs a control signal MDBL8 with an "H" level to set the number of burst output bits to 8 bits when the address signal AD0 has an "L" level and the address signal AD1 has an "H" level, and outputs the control signal MDBL8 with an "L" level to set the number of burst output bits to 4 bits when the address signal AD0 has an "H" level and the address signal AD1 has an "L" level. Accordingly, the switch circuit 14 sets the number of bits sequentially output from each output terminal in the burst reading.

The clock control circuit 30 sends the input clock signal CL to the counter 18 when the input control signal CK has an "H" level and does not send the input clock signal CL to the counter 18 when the input control signal CK has an "L" level.

The clock control circuit 30 generates a clock signal CLKI at the output timing of a sequence of bits to be output at the time of the aforementioned burst outputting, and sends the clock signal CLKI to the counter 18.

The X decoder 13 generates word line select signals corresponding to word lines WD0–WD4095 based on the row address signals AD1AT–AD12AT and sends those signals to the gates of the associated memory-cell transistors in the memory cell area 16 which are respectively connected to the word lines WD0–WD4095.

Based on the input row address signal AD0AT and column address signals AD4RT–AD7RT, the VG decoder 15 sends a VG selector 26 virtual ground control signals VG00 to VG03 which control the connection of the main bit lines to the ground line.

The Y decoder 17 generates Y selector control signals Y00 to Y07 that performs control as to which main bit line in the memory cell area 16 should be connected to which sense amplifier, based on the row address signal AD0AT and the column address signals AD4RT, AD6RT and AD7RT, and sends those control signals to a Y selector circuit 22.

Based on the column address signal AD6RT, the Y decoder 17 generates precharge signals P0 and P1 for performing control as to which main bit line of the memory cell area 16 should be precharged, and Y selector control signals Y0 to Y7 for performing control as to which main bit line in the memory cell area 16 should be connected to which sense amplifier. The Y decoder 17 then sends the generated precharge signals P0 and P1 and Y selector control signals Y0 and Y1 to the Y selector circuit 22.

The Y2 decoder 19 generates Y selector control signals Y20 to Y23 for performing control as to which main bit line in the memory cell area 16 should be connected to which sense amplifier, based on the column address signals AD2RT and AD3RT, and sends those control signals to the Y selector circuit 22.

Based on the column address signals AD4RT–AD7RT, the VGPG decoder 21 sends a precharge circuit 27 virtual ground control signals VG10 and VG11, which control as to which main virtual ground line is to be connected to the ground line (the line with the ground potential), and a precharge control signal PG1 which controls as to which main virtual ground line is to be precharged.

For example, the X decoder 13 decodes the row address signals AD1AT–AD12AT output from the address latch 12 and selects and enables one of the word lines WD0–WD4095. Accordingly, the memory-cell transistors which are arranged in the row direction of each of the cell plates 16A0–16A15 in the memory cell area 16A and whose gates are connected to the selected and enabled word lines are selected simultaneously to be ready for reading data.

Figure 3:
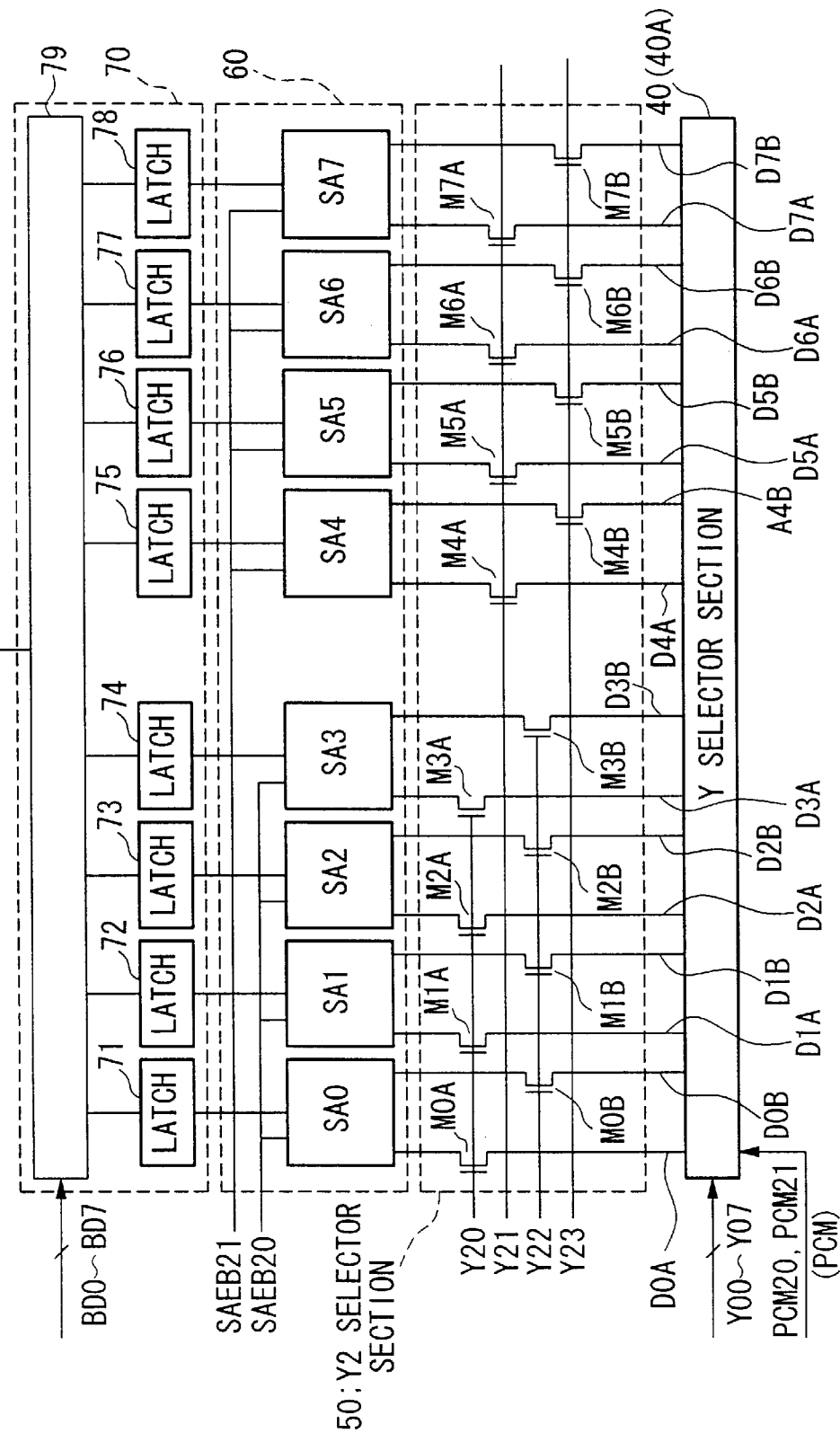
FIG. 3 is a block diagram showing the structures of a Y selector circuit 22, a sense amplifier circuit 23 and a latch circuit 24 in FIG. 1 per one output terminal of the semiconductor memory device, for example, a Y selector section 40, a Y2 selector section 50, a sense amplifier section 60 and a latch section 70 which correspond to an output terminal TO0.

Based on the individual control signals generated by the aforementioned Y decoder 17, Y2 decoder 19, bank decoder 20, VG decoder 15 and VGPG decoder 21, data is read out from those memory-cell transistors which are enabled by the selected word line as illustrated in FIG. 3 for each of the output terminals TO0–TO31. FIG. 3 is a block diagram showing the structures of the Y selector circuit 22, a sense amplifier circuit 23 and a latch circuit 24 per one output terminal of the semiconductor memory device, for example, a Y selector section 40, a Y2 selector section 50, a sense amplifier section 60 and a latch section 70 which correspond to the output terminal TO0. The Y selector circuit 22 comprises the Y selector section 40 and the Y2 selector section 50 for each of the output terminals TO0–TO31.

In this diagram, based on the input Y selector control signals Y00–Y07, Y10 and Y11, and precharge signals P0 and P1, the Y selector section 40 selects an associated one of unillustrated eight main bit lines for outputting data from the associated memory-cell transistors in the cell plate 16A0 and connects the selected main bit line to the associated data line.

Specifically, there are eight main bit lines corresponding to each of data lines D0A, D0B, D1A, D1B, D2A, D2B, D3A, D3B, D4A, D4B, D5A, D5B, D6A, D6B, D7A and D7B, and one of the eight main bit lines is selected by the Y selector section 40 to read data stored in the associated memory-cell transistors.

The Y2 selector section 50 comprises transistors M0A, M0B, M1A, M1B, M2A, M2B, M3A, M3B, M4A, M4B, M5A, M5B, M6A, M6B, M7A and M7B, which are, for example, n channel MOS transistors.

Based on the Y selector control signals Y20 and Y22 input from the Y2 decoder 19, the Y2 selector section 50 sends data on either the data line D0A or the data line D0B to a sense amplifier SA0 in the sense amplifier section 60.

Specifically, when the Y selector control signal Y20 has an "H" level and the Y selector control signal Y22 has an "L" level, the transistor M0A in the Y2 selector section 50 is turned on and the transistor M0B is turned off, so that data on the data line D0A is sent to the sense amplifier SA0.

When the Y selector control signal Y20 has an "L" level and the Y selector control signal Y22 has an "H" level, on the other hand, the transistor M0A in the Y2 selector section 50 is turned off and the transistor M0B is turned on, so that data on the data line D0B is sent to the sense amplifier SA0.

Likewise, based on the Y selector control signals Y20 and Y22 input from the Y2 decoder 19, the Y2 selector section 50 sends data on either the data line D1A or the data line D1B to a sense amplifier SA1 in the sense amplifier section 60, sends data on either the data line D2A or the data line D2B to a sense amplifier SA2 and sends data on either the data line D3A or the data line D3B to a sense amplifier SA3.

Based on the Y selector control signals Y21 and Y23 input from the Y2 decoder 19, the Y2 selector section 50 sends data on either the data line D4A or the data line D4B to a sense amplifier SA4 in the sense amplifier section 60.

Specifically, when the Y selector control signal Y21 has an "H" level and the Y selector control signal Y23 has an "L" level, the transistor M4A in the Y2 selector section 50 is turned on and the transistor M4B is turned off, so that data on the data line D4A is sent to the sense amplifier SA4.

When the Y selector control signal Y21 has an "L" level and the Y selector control signal Y23 has an "H" level, on the other hand, the transistor M4A in the Y2 selector section 50 is turned off and the transistor M4B is turned on, so that data on the data line D4B is sent to the sense amplifier SA4.

Likewise, based on the Y selector control signals Y21 and Y23 input from the Y2 decoder 19, the Y2 selector section 50 sends data on either the data line D5A or the data line D5B to a sense amplifier SA5 in the sense amplifier section 60, sends data on either the data line D6A or the data line D6B to a sense amplifier SA6 and sends data on either the data line D7A or the data line D7B to a sense amplifier SA7.

The sense amplifier section 60 comprises the sense amplifiers SA0, SA1, SA2, SA3, SA4, SA5, SA6 and SA7.

The sense amplifier SA0 determines whether data stored in each memory-cell transistor is "0" or "1" by comparing the value of the current that flows in the selected one of the data lines D0A and D0B with the current value of a reference signal RG from a reference cell 35, and sends the determination result to a latch 71 in the latch section 70.

Likewise, each of the sense amplifiers SA1 to SA7 determines whether data stored in each memory-cell transistor is "0" or "1" by comparing the current value input through the transistor connected to that sense amplifier with the reference current value of the reference signal RG from the reference cell 35, and sends the determination result to an associated one of latches 72 to 78 in the latch section 70.

The latches 71–78 holds data on the determination results input from the associated sense amplifiers SA0–SA7 based on a latch signal input at a predetermined timing.

When the number of burst readout bits set in the switch circuit 14 (FIGS. 1 and 2) is "8", the sense amplifiers SA0–SA7 are enabled by sense amplifier enable signals SAEB21 and SAEB22 supplied from a delay circuit 31 (FIGS. 1 and 2), and data on the results of determination made by the sense amplifiers SA0–SA7 are sent to the associated latches 71–78.

When the number of burst readout bits set in the switch circuit 14 (FIGS. 1 and 2) is "4", on the other hand, either a group of the sense amplifiers SA0–SA3 or a group of the sense amplifiers SA4–SA7 are enabled based on an address signal by the sense amplifier enable signals SAEB21 and SAEB22 supplied from the delay circuit 31 (FIGS. 1 and 2), and data on the results of determination made by the sense amplifiers SA0–SA3 or data on the results of determination made by the sense amplifiers SA4–SA7 are sent to the associated latches 71–74 or the associated latches 75–78. That is, when the number of burst bits (burst length) is "4", half the sense amplifiers that are not used are not enabled, thus reducing consumed power, as has been explained in the foregoing description of the prior art.

The latches 71–78 send the held data to a burst selector 79. When the burst length is 8 bits, the burst selector 79 sends the data input from the latches 71–78 to the output terminal TO0 in order from the latch 71 based on select signals BD0 to BD7 supplied from the burst decoder 29 (FIGS. 1 and 2).

When the burst length is 4 bits, on the other hand, the burst selector 79 sends the data input from the latches 71–78, as either data from a group of the latches 71–74 or the data from a group of the latches 75–78, to the output terminal TO0 in the order of the latches in the associated group in response to the select signals BD0–BD7 supplied from the burst decoder 29 (FIGS. 1 and 2) based on the input column address signals AD0RT–AD2RT.

The above will now is discussed specifically. In FIGS. 1 and 2, the counter 18 performs counting based on the values of data of the column address signals AD0RT–AD2RT supplied from the address latch 12 as set values every time the clock signal CL is input.

Further, the counter 18 performs counting between "0" to "7" when the control signal MDBL8 has an "H" level (in the case of the burst output of 8 bits), i.e., the counter 18 performs counting of the count value of {count signal CT2, count signal CT1, count signal CT0} from {0, 0, 0} to {1, 1, 1} for each input of the clock signal CL.

Furthermore, the counter 18 performs counting between "0" to "3" when the control signal MDBL8 has an "L" level and the column address signal AD2RT has an "L" level (in the case of the burst output of 4 bits), i.e., the counter 18 performs counting of the count value of {count signal CT2, count signal CT1, count signal CT0} from {0, 0, 0} to {0, 1, 1}. When the column address signal AD2RT has an "H" level, the counter 18 performs counting between "4" to "7", i.e., the counter 18 performs counting of the count value of {count signal CT2, count signal CT1, count signal CT0} from {1, 0, 0} to {1, 1, 1}.

A burst decoder 29 performs decoding of the input count value {count signal CT2, count signal CT1, count signal CT0} based on a truth table in FIG. 4 which shows the correlation between input signals and output signals, and outputs the select signals BD0–BD7 as the decoding results. Specifically, the burst decoder 29 outputs a select signal {0, 0, 0, 0, 0, 0, 0, 1} as a select signal {select signal BD7, select signal BD6, select signal BD5, select signal BD4, select signal BD3, select signal BD2, select signal BD1, select signal BD0} when the count value is {0, 0, 0}, and outputs a select signal {1, 0, 0, 0, 0, 0, 0, 1} when the count value is {1, 1, 1}. FIG. 4 shows the table (truth table) that indicates the correlation between the count value input to the burst decoder 29 and the value of the select signal output therefrom.

Accordingly, as mentioned above, the burst selector 79 in the latch circuit 24 is controlled to either the case where the burst output is 8 bits or the case where the burst output is 4 bits for each of the output terminals TO0–TO31 by the aforementioned select signal {select signal BD7, select signal BD6, select signal BD5, select signal BD4, select signal BD3, select signal BD2, select signal BD1, select signal BD0} based on the count value {count signal CT2, count signal CT1, count signal CT0} output from the counter 18.

Specifically, with the burst length being 8 bits, for example, when the select signal {0, 0, 0, 0, 0, 0, 0, 1} to the select signal {1, 0, 0, 0, 0, 0, 0, 0} are input from the burst decoder 29 (FIGS. 1 and 2) in FIG. 4, the burst selector 79 outputs the data stored in the latch 71 to the output terminal TO0 in the case of the select signal {0, 0, 0, 0, 0, 0, 0, 1} and sequentially outputs the data stored in the latches 71–78 to the output terminal TO0 in the burst length of 8 bits every time the select signal {select signal BD7, select signal BD6, select signal BD5, select signal BD4, select signal BD3, select signal BD2, select signal BD1, select signal BD0} is changed.

With the burst length being 4 bits, on the other hand, when the select signal {0, 0, 0, 0, 0, 0, 0, 1} to the select signal {0, 0, 0, 0, 1, 0, 0, 0} or the select signal {0, 0, 0, 1, 0, 0, 0, 1} to the select signal {1, 0, 0, 0, 0, 0, 0, 0} are input from the burst decoder 29 (FIG. 1 and 2), the burst selector 79 outputs the data stored in the latch 71 to the output terminal TO0 in the case of the select signal {0, 0, 0, 0, 0, 0, 0, 1} and sequentially outputs the data stored in the latches 71–78 to the output terminal TO0 in the burst length of 4 bits every time the select signal {select signal BD7, select signal BD6, select signal BD5, select signal BD4, select signal BD3, select signal BD2, select signal BD1, select signal BD0} is changed.

Figure 5:
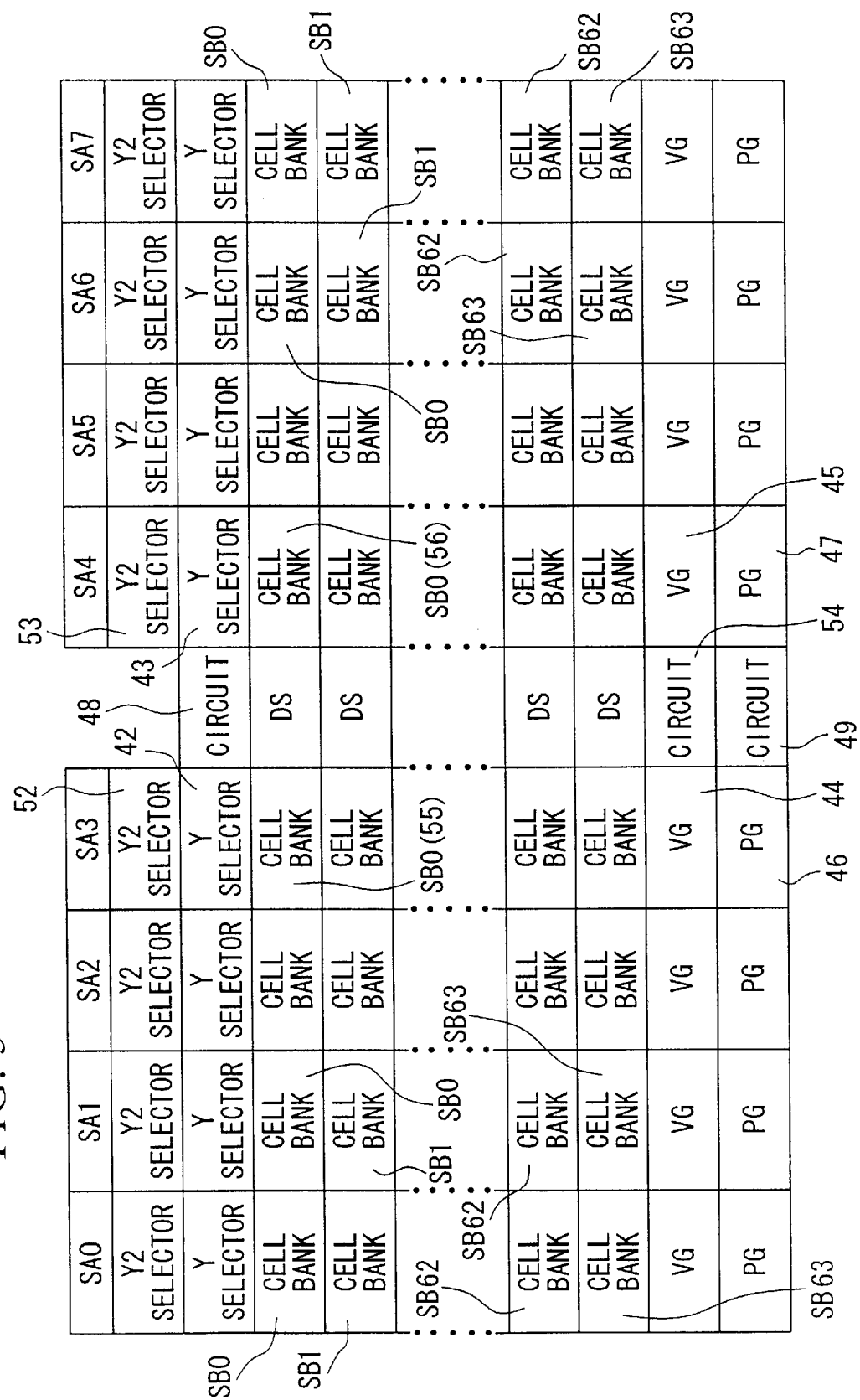
FIG. 5 is a block diagram illustrating the correlation among a memory cell area 16, the Y selector circuit 22, the sense amplifier circuit 23, a VG selector 26 and a precharge circuit 27 in FIG. 2.

A description will now be given of the structures of the memory cell area 16, the Y selector circuit 22, the sense amplifier circuit 23, the VG selector 26 and the precharge circuit, with reference to FIG. 5. FIG. 5 is a block diagram illustrating the correlation among the memory cell area 16, the Y selector circuit 22, the sense amplifier circuit 23, a VG circuit 45 (one portion of the VG selector 26 in FIGS. 1 and 2), a VG circuit 45 (one portion of the VG selector 26 in FIGS. 1 and 2), a PG circuit 46 (one portion of the precharge circuit 27 in FIGS. 1 and 2), a PG circuit 47 (one portion of the VG selector 26 in FIGS. 1 and 2), etc.

In this diagram, a collection of the Y selectors for one output terminal which include the Y2 selector 52 and the Y2 selector 53 corresponds to the Y2 selector section 50 in FIG. 3.

Likewise, a collection of the Y selectors for one output terminal which include the Y selector 42 and the Y selector 43 corresponds to the selector section 40 in FIG. 3.

FIG. 5, like FIG. 3, shows that constituting portion in the semiconductor memory device that corresponds to one of the output terminals TO0–TO31, i.e., the output terminal TO0. The capacity of memory-cell transistors per output terminal is 2 MBits, a half of the cell plate 160. The Y2 selector section 50 (FIG. 3) comprises Y2 selectors provided in association with the sense amplifiers SA0–SA7. The Y selector section 40 (FIG. 3) comprises Y selectors provided in association with the sense amplifiers SA0–SA7 and a circuit 48.

Cell banks SB0 to SB63, each of which is comprised of 64 word lines and 16 main bit lines, are provided for each of the sense amplifiers SA0–SA7. With the burst length being set to 4 bits, a dummy cell area DS is inserted between each cell bank corresponding to the sense amplifier SA3 and each associated cell bank corresponding to the sense amplifier SA4 in such a way that when the memory-cell transistors that correspond to the sense amplifiers SA0–SA3 are selected by the column address signals AD2RT and AD3RT, for example, the current does not flow in the memory-cell transistor area that correspond to the sense amplifiers SA0–SA3 and the memory-cell transistor area that correspond to the sense amplifiers SA4–SA7 even if the sub bit lines and sub bit ground lines of the memory-cell transistors that correspond to the sense amplifiers SA0–SA7 are not precharged.

Further, each VG circuit is a unit circuit that is one component of the VG selector 26 and is provided for each of the sense amplifiers SA0–SA7. That is, the VG selector 26 is comprised of eight VG circuits provided for the sense amplifiers of each of the output terminals TO0–TO31, and a circuit 54.

Each PG circuit is a unit circuit that is one component of the precharge circuit 27 and is provided for each of the sense amplifiers SA0–SA7. That is, the precharge circuit 27 is comprised of eight PG circuits provided for the sense amplifiers of each of the output terminals TO0–TO31, and a circuit 49.

Referring now to FIGS. 6 to 9, a description will be given of the relationship among the Y2 selectors 52, the Y2 selectors 53, the Y selectors 42, the single unit VG circuits 44 and 45 that are components of the VG selector 26, the single unit PG circuits 46 and 47 that are components of the precharge circuit 27, the main bit lines and the main virtual ground lines, all corresponding to the sense amplifiers SA3 and SA4 in FIG. 5.

Figure 6:
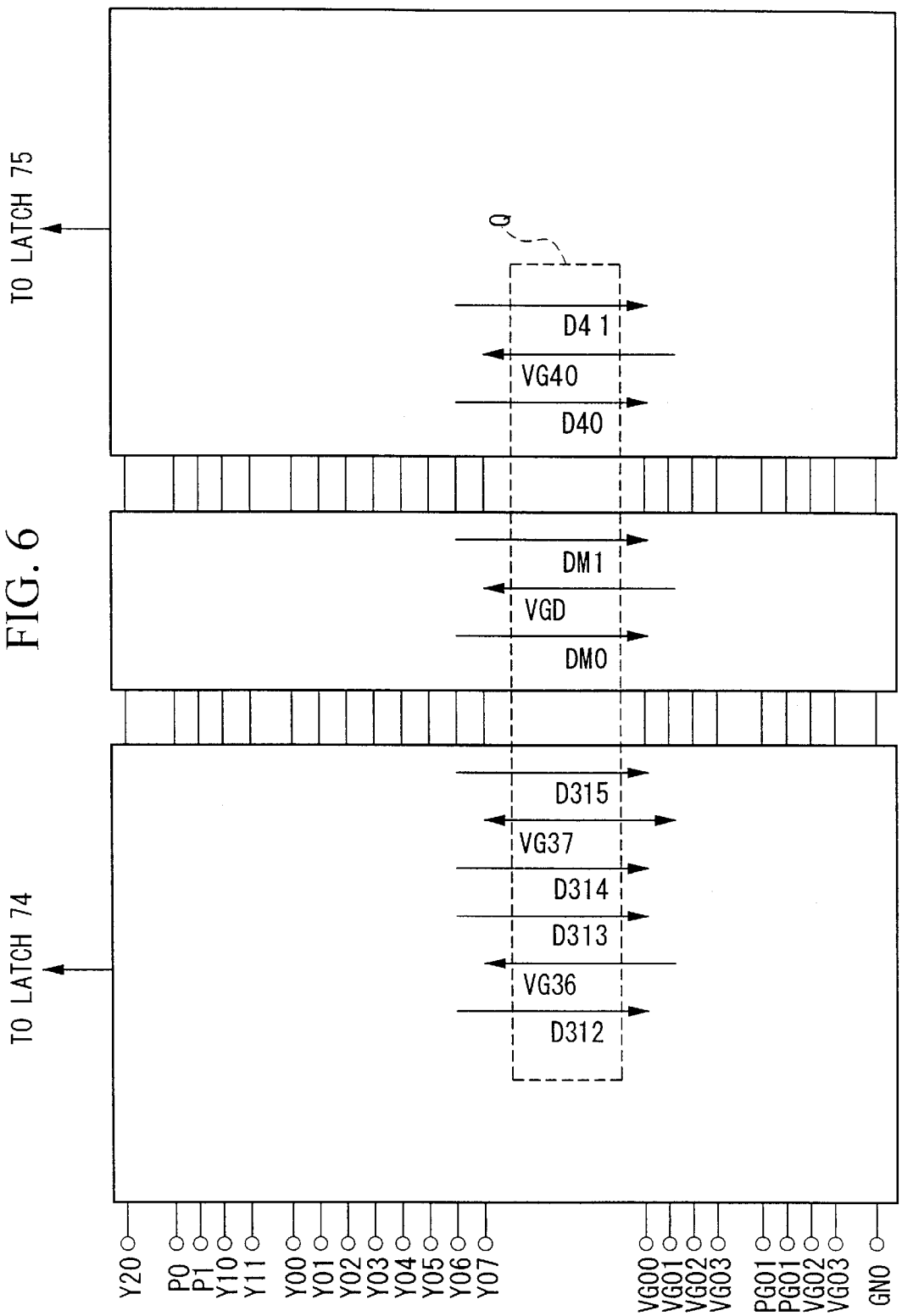
FIG. 6 is a conceptual diagram showing the relationship among a block BK1 which includes a Y2 selector 52, a Y2 selector 53, a Y selector 42, a single unit VG circuit 44 constituting the VG selector 26, and a single unit PG circuit 46 constituting the precharoe circuit 27, all corresponding to a sense amplifier SA3, a block BK2 which includes a Y2 selector 52, a Y2 selector 53, a Y selector 42, a single unit VG circuit 45 constituting the VG selector 26, and a single unit PG circuit 47 constituting the precharge circuit 27, all corresponding to a sense amplifier SA4, and a block BK3 including a dummy cell area.

FIG. 6 is a conceptual diagram showing the relationship among a block BK1 which includes the Y2 selector 52, the Y2 selector 53, the Y selector 42, the single unit VG circuit 44 constituting the VG selector 26, and the single unit PG circuit 46 constituting the precharge circuit 27, all corresponding to the sense amplifier SA3, a block BK2 which includes the Y2 selector 52, the Y2 selector 53, the Y selector 42, the single unit VG circuit 45 constituting the VG selector 26, and the single unit PG circuit 47 constituting the precharge circuit 27, all corresponding to the sense amplifier SA4, and a block BK3 including the dummy cell area DS.

Figure 7:
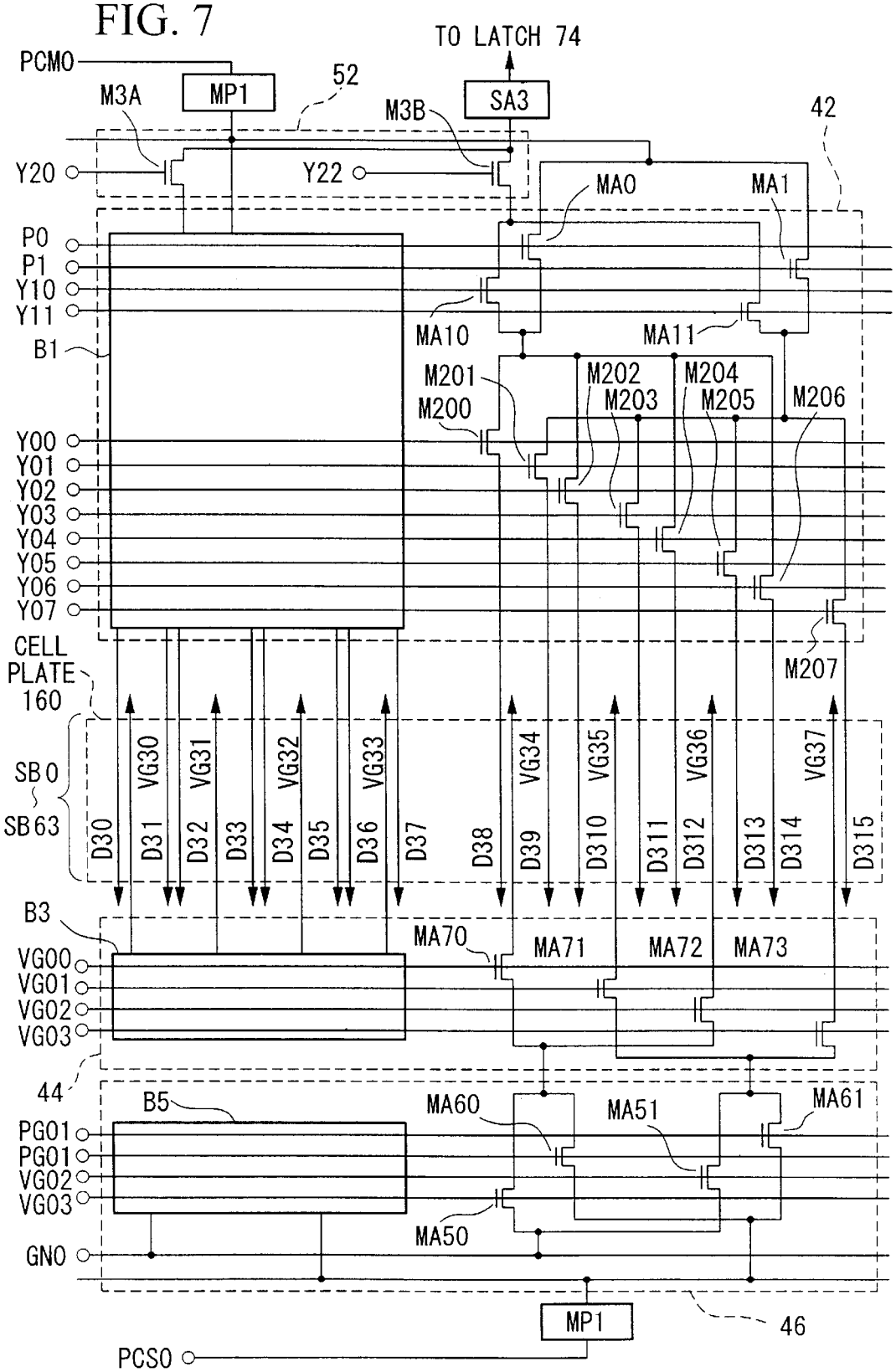
FIG. 7 is a block diagram depicting the structure of the block BK1 in FIG. 6.
Figure 8:
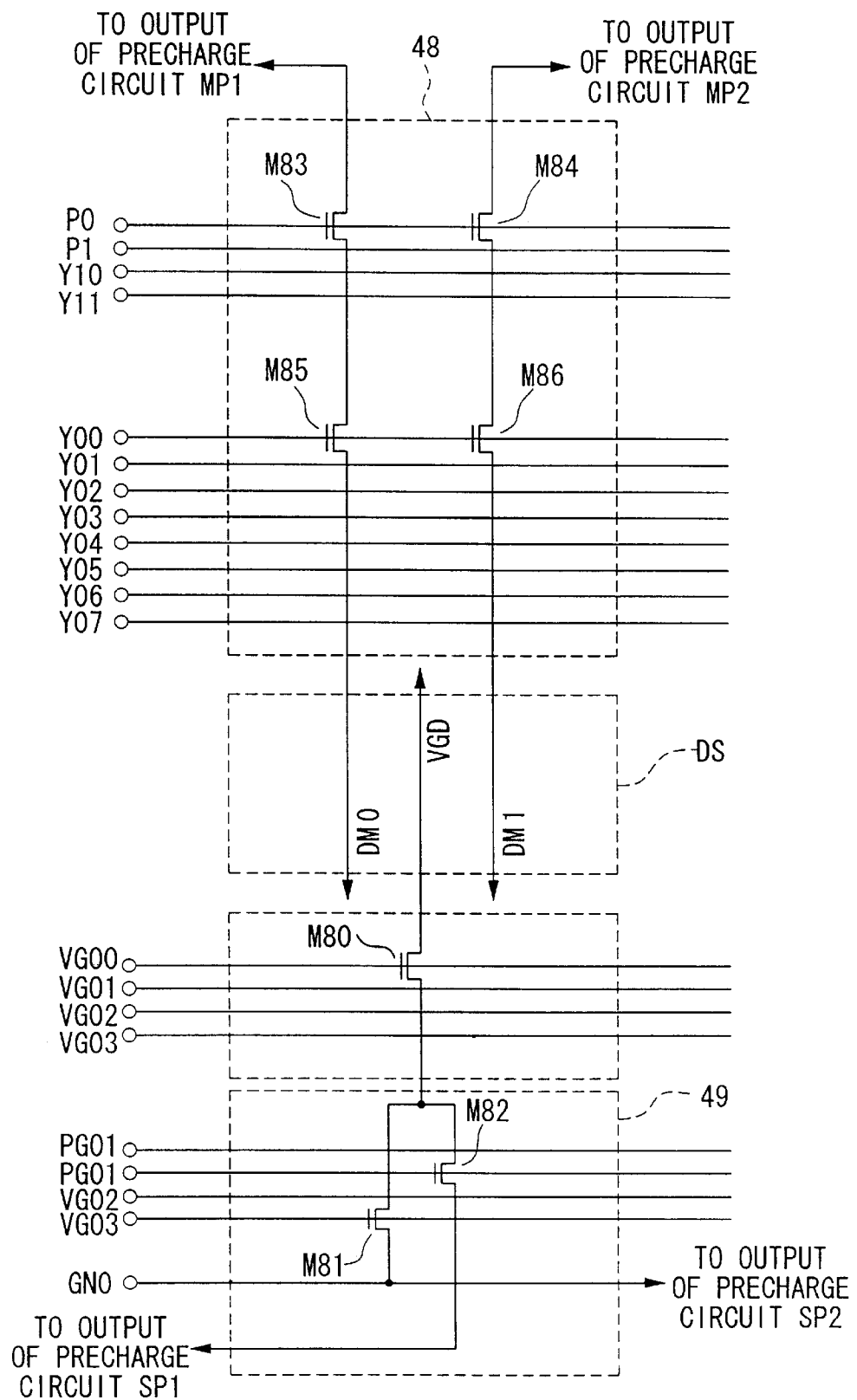
FIG. 8 is a block diagram depicting the structure of the block BK2 in FIG. 6.
Figure 9:
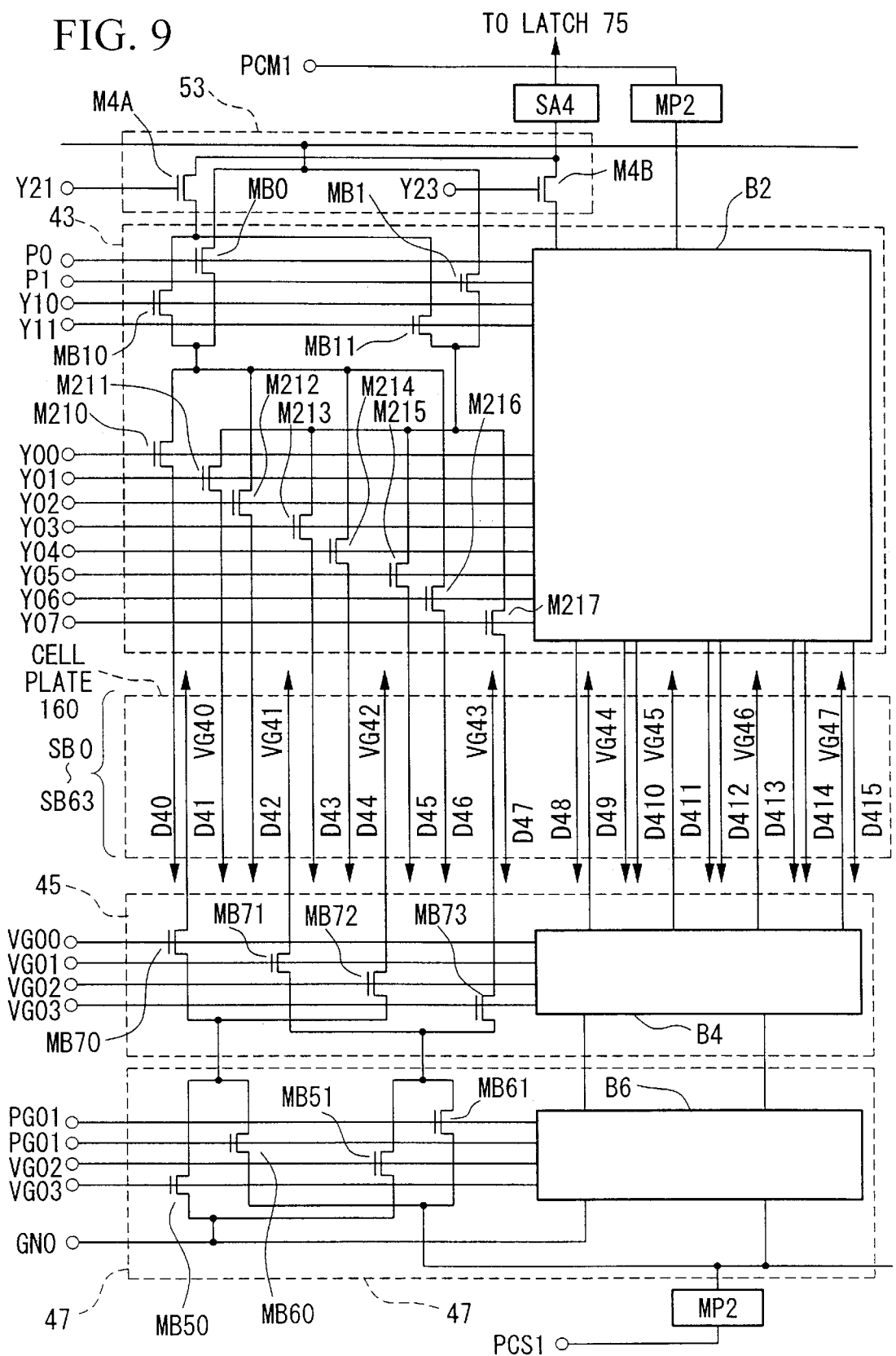
FIG. 9 is a block diagram depicting the structure of the block BK3 in FIG. 6.

FIG. 7 is a block diagram depicting the structure of the block BK1 in FIG. 6, FIG. 8 is a block diagram depicting the structure of the block BK2 in FIG. 6, and FIG. 9 is a block diagram depicting the structure of the block BK3 in FIG. 6.

In FIGS. 6–9, the Y2 selector 52 comprises n channel MOS transistors M3A and M3B and performs control as to which group, a group of main bit lines D30 to D37 or a group of main bit lines D38 to D315, is to be selected. Specifically, when the Y selector control signal Y20 has an "H" level and the Y selector control signal Y22 has an "L" level, the transistor M3A in the Y2 selector 52 is turned on to select the group of the main bit lines D30–D37.

When the Y selector control signal Y20 has an "L" level and the Y selector control signal Y22 has an "H" level, on the other hand, the transistor M3B in the Y2 selector 52 is turned on to select the group of the main bit lines D38–D315.

The Y2 selector 53 comprises n channel MOS transistors M4A and M4B and performs control as to which group, a group of main bit lines D40 to D47 or a group of main bit lines D48 to D415, is to be selected. Specifically, when the Y selector control signal Y21 has an "H" level and the Y selector control signal Y23 has an "L" level, the transistor M4A in the Y2 selector 53 is turned on to select the group of the main bit lines D40–D47.

When the Y selector control signal Y21 has an "L" level and the Y selector control signal Y23 has an "H" level, on the other hand, the transistor M4B in the Y2 selector 53 is turned on to select the group of the main bit lines D48–D415.

The Y selector 42 comprises n channel MOS transistors MA10, MA1, MA11, MA1, and M200 to M207, and a block B1 that comprises transistors similar in structure to the transistors MA10, MA1, MA11, MA1, and M200–M207.

The Y selector 42 performs control as to which group, a group of the main bit lines D38, D310, D312 and D314 or a group of the main bit lines D39, D311, D313 and D315, is to be connected to the transistor M3B, by means of the transistors MA10 and MA11. Specifically, when the Y selector control signal Y10 has an "H" level and the Y selector control signal Y11 has an "L" level, the transistor MA10 in the Y selector 42 is turned on to connect the group of the main bit lines D38, D310, D312 and D314 to the transistor M3B.

When the Y selector control signal Y10 has an "L" level and the Y selector control signal Y11 has an "H" level, on the other hand, the transistor MA11 in the Y selector 42 is turned on to connect the group of the main bit lines D39, D311, D313 and D315 to the transistor M3B.

The Y selector 42 performs similar control with respect to the main bit lines D30–D37 that are controlled by the block B1. Specifically, when the Y selector control signal Y10 has an "H" level and the Y selector control signal Y11 has an "L" level, the transistor in the block B1 of the Y selector 42 that corresponds to the transistor MA10 is turned on to connect the group of the main bit lines D30, D32, D34 and D36 to the transistor M3A.

When the Y selector control signal Y10 has an "L" level and the Y selector control signal Y11 has an "H" level, on the other hand, the transistor in the block B1 of the Y selector 42 that corresponds to the transistor MA11 is turned on to connect the group of the main bit lines D31, D33, D35 and D37 to the transistor M3A.

The Y selector 42 performs control as to which group, a group of the main bit lines D38, D310, D312 and D314 or a group ofthe main bit lines D39, D311, D313 and D315, is to be connected to a precharge circuit MP1, by means of the transistors MA0 and MA1. Specifically, when the precharge signal P0 has an "H" level and the precharge signal P1 has an "L" level, the transistor MA0 in the Y selector 42 is turned on to connect the group of the main bit lines D38, D310, D312 and D314 to the precharge circuit MP1.

When the precharge signal P0 has an "L" level and the precharge signal P1 has an "H" level, on the other hand, the transistor MA1 in the Y selector 42 is turned on to connect the group of the main bit lines D39, D311, D313 and D315 to the precharge circuit MP1.

The Y selector 42 performs similar control with respect to the main bit lines D30–D37 that are controlled by the block B1. Specifically, when the precharge signal P0 has an "H" level and the precharge signal P1 has an "L" level, the transistor in the block B1 of the Y selector 42 that corresponds to the transistor MA0 is turned on to connect the group of the main bit lines D30, D32, D34 and D36 to the precharge circuit MP1.

When the precharge signal P0 has an "L" level and the precharge signal P1 has an "H" level, on the other hand, the transistor in the block B1 of the Y selector 42 that corresponds to the transistor MA1 is turned on to connect the group of the main bit lines D31, D33, D35 and D37 to the precharge circuit MP1.

The Y selector 43 comprises n channel MOS transistors MB10, MB1, MB11, MB1, and M210 to M217, and a block B2 that comprises transistors similar in structure to the transistors MB10, MB1, MB11, MB1, and M210–M217.

The Y selector 43 performs control as to which group, a group of the main bit lines D40, D42, D44 and D46 or a group of the main bit lines D41, D413, D45 and D47, is to be connected to the transistor M4A, by means of the transistors MB10 and MB11. Specifically, when the Y selector control signal Y10 has an "H" level and the Y selector control signal Y11 has an "L" level, the transistor MB10 in the Y selector 43 is turned on to connect the group of the main bit lines D40, D42, D44 and D46 to the transistor M4A.

When the Y selector control signal Y10 has an "L" level and the Y selector control signal Y11 has an "H" level, on the other hand, the transistor MB11 in the Y selector 43 is turned on to connect the group of the main bit lines D41, D413, D45 and D47 to the transistor M4A.

The Y selector 43 performs similar control with respect to the main bit lines D48–D415 that are controlled by the block B2. Specifically, when the Y selector control signal Y10 has an "H" level and the Y selector control signal Y11 has an "L" level, the transistor in the block B2 of the Y selector 43 that corresponds to the transistor MB10 is turned on to connect the group of the main bit lines D48, D410, D412 and D414 to the transistor M4B.

When the Y selector control signal Y10 has an "L" level and the Y selector control signal Y11 has an "H" level, on the other hand, the transistor in the block B2 of the Y selector 43 that corresponds to the transistor MB11 is turned on to connect the group of the main bit lines D49, D411, D413 and D415 to the transistor M4B.

The Y selector 43 performs control as to which group, a group of the main bit lines D40, D42, D44 and D46 or a group of the main bit lines D41, D43, D45 and D47, is to be connected to a precharge circuit MP2, by means of the transistors MB0 and MB1. Specifically, when the precharge signal P0 has an "H" level and the precharge signal P1 has an "L" level, the transistor MB0 in the Y selector 43 is turned on to connect the group of the main bit lines D40, D42, D44 and D46 to the precharge circuit MP2.

When the precharge signal P0 has an "L" level and the precharge signal P1 has an "H" level, on the other hand, the transistor MB1 in the Y selector 43 is turned on to connect the group of the main bit lines D41, D43, D45 and D47 to the precharge circuit MP2.

The Y selector 43 performs similar control with respect to the main bit lines D48–D415 that are controlled by the block B2. Specifically, when the precharge signal P0 has an "H" level and the precharge signal P1 has an "L" level, the transistor in the block B2 of the Y selector 43 that corresponds to the transistor MB0 is turned on to connect the group of the main bit lines D48, D410, D412 and D414 to the precharge circuit MP2.

When the precharge signal P0 has an "L" level and the precharge signal P1 has an "H" level, on the other hand, the transistor in the block B2 of the Y selector 43 that corresponds to the transistor MB1 is turned on to connect the group of the main bit lines D49, D411, D413 and D415 to the precharge circuit MP2.

The circuit 48 comprises n channel MOS transistors M83, M84, M85 and M86.

When the precharge signal P0 has an "H" level and the Y selector control signal Y00 has an "H" level, the transistors M83 and M85 are turned on to connect the main bit line DM0 to the precharge circuit MP1 and the transistors M84 and M86 are turned on to connect the main bit line DM1 to the precharge circuit MP2.

The PG circuit 46 comprises n channel MOS transistors MA50, MA51, MA60 and MA61 and a block B5 which comprises transistors corresponding to and similar in structure to the transistors MA50, MA51, MA60 and MA61.

The PG circuit 46 performs control as to which group, a group of main virtual ground lines VG34 and VG36 or a group of main virtual ground lines VG35 and VG37, is to be connected to a ground line GND (line with the ground potential), by means of the transistors MA50 and MA51. Specifically, when the virtual ground control signal VG10 has an "H" level and the virtual ground control signal VG11 has an "L" level, the transistor MA50 in the PG circuit 46 is turned on to connect the group of the main virtual ground lines VG34 and VG36 to the ground line GND.

When the virtual ground control signal VG10 has an "L" level and the virtual ground control signal VG11 has an "H" level, on the other hand, the transistor MA51 in the PG circuit 46 is turned on to connect the group of the main virtual ground lines VG35 and VG37 to the ground line GND.

The PG circuit 46 performs similar control with respect to main virtual ground lines VG30 to VG33 that are controlled by the block B5. Specifically, when the virtual ground control signal VG10 has an "H" level and the virtual ground control signal VG11 has an "L" level, the transistor in the block B5 of the PG circuit 46 that corresponds to the transistor MA50 is turned on to connect the group of the main virtual ground lines VG30 and VG32 to the ground line GND.

When the virtual ground control signal VG10 has an "L" level and the virtual ground control signal VG11 has an "H" level, on the other hand, the transistor in the block B5 of the PG circuit 46 that corresponds to the transistor MA51 is turned on to connect the group of the main virtual ground lines VG31 and VG33 to the ground line GND.

The PG circuit 46 performs control as to which group, the group of the main virtual ground lines VG34 and VG36 or the group of the main virtual ground lines VG35 and VG37, is to be connected to a precharge circuit SP1 by means of the transistors MA60 and MA61. Specifically, when the precharge control signal PG0 has an "H" level and the precharge control signal PG1 has an "L" level, the transistor MA60 in the PG circuit 46 is turned on to connect the group of the main virtual ground lines VG34 and VG36 to the precharge circuit SP1.

When the precharge control signal PG0 has an "L" level and the precharge control signal PG1 has an "H" level, on the other hand, the transistor MA61 in the PG circuit 46 is turned on to connect the group of the main virtual ground lines VG35 and VG37 to the precharge circuit SP1.

The PG circuit 46 performs similar control with respect to the main virtual ground lines VG30 to VG33 that are controlled by the block B5. Specifically, when the precharge control signal PG0 has an "H" level and the precharge control signal PG1 has an "L" level, the transistor in the block B5 of the PG circuit 46 that corresponds to the transistor MA60 is turned on to connect the group of the main virtual ground lines VG30 and VG32 to the precharge circuit SP1.

When the precharge control signal PG0 has an "L" level and the precharge control signal PG1 has an "H" level, on the other hand, the transistor in the block B5 of the PG circuit 46 that corresponds to the transistor MA61 is turned on to connect the group of the main virtual ground lines VG31 and VG33 to the precharge circuit SP1.

The PG circuit 47 comprises n channel MOS transistors MB50, MB51, MB60 and MB61 and a block B6 which comprises transistors corresponding to and similar in structure to the transistors MB50, MB51, MB60 and MB61.

The PG circuit 47 performs control as to which group, a group of main virtual ground lines VG40 and VG42 or a group of main virtual ground lines VG41 and VG43, is to be connected to the ground line GND by means of the transistors MB50 and MB51. Specifically, when the virtual ground control signal VG10 has an "H" level and the virtual ground control signal VG11 has an "L" level, the transistor MB50 in the PG circuit 47 is turned on to connect the group of the main virtual ground lines VG40 and VG42 to the ground line GND.

When the virtual ground control signal VG10 has an "L" level and the virtual ground control signal VG11 has an "H" level, on the other hand, the transistor MB51 in the PG circuit 47 is turned on to connect the group of the main virtual ground lines VG41 and VG43 to the ground line GND.

The PG circuit 47 performs similar control with respect to main virtual ground lines VG44 to VG47 that are controlled by the block B6. Specifically, when the virtual ground control signal VG10 has an "H" level and the virtual ground control signal VG11 has an "L" level, the transistor in the block B6 of the PG circuit 47 that corresponds to the transistor MB50 is turned on to connect the group of the main virtual ground lines VG44 and VG46 to the ground line GND.

When the virtual ground control signal VG10 has an "L" level and the virtual ground control signal VG11 has an "H" level, on the other hand, the transistor in the block B6 of the PG circuit 47 that corresponds to the transistor MB51 is turned on to connect the group of the main virtual ground lines VG45 and VG47 to the ground line GND.

The PG circuit 47 performs control as to which group, the group of the main virtual ground lines VG40 and VG42 or the group of the main virtual ground lines VG41 and VG43, is to be connected to a precharge circuit SP2 by means of the transistors MB60 and MB61. Specifically, when the precharge control signal PG0 has an "H" level and the precharge control signal PG1 has an "L" level, the transistor MB60 in the PG circuit 47 is turned on to connect the group of the main virtual ground lines VG40 and VG42 to the precharge circuit SP2.

When the precharge control signal PG0 has an "L" level and the precharge control signal PG1 has an "H" level, on the other hand, the transistor MB61 in the PG circuit 47 is turned on to connect the group of the main virtual ground lines VG41 and VG43 to the precharge circuit SP2.

The PG circuit 47 performs similar control with respect to the main virtual ground lines VG44 to VG47 that are controlled by the block B6. Specifically, when the precharge control signal PG0 has an "H" level and the precharge control signal PG1 has an "L" level, the transistor in the block B6 of the PG circuit 47 that corresponds to the transistor MB60 is turned on to connect the group of the main virtual ground lines VG44 and VG46 to the precharge circuit SP2.

When the precharge control signal PG0 has an "L" level and the precharge control signal PG1 has an "H" level, on the other hand, the transistor in the block B6 of the PG circuit 47 that corresponds to the transistor MB61 is turned on to connect the group of the main virtual ground lines VG45 and VG47 to the precharge circuit SP2.

The circuit 49 comprises n channel MOS transistors M81 and M82.

When the virtual ground control signal VG10 has an "H" level, the transistor M81 in the circuit 49 is turned on to switch the connection state so that a main virtual ground line VGD is connected to the ground line GND. When the precharge control signal PG0 has an "H" level, the transistor M82 in the circuit 49 is turned on to switch the connection state so that the main virtual ground line VGD is connected to the precharge circuit SP1.

The VG circuit 44 comprises n channel MOS transistors MA70, MA71, MA72 and MA73 and a block B3 which comprises transistors corresponding to and similar in structure to the transistors MA70, MA71, MA72 and MA73.

The VG circuit 44 performs control as to which one of the main virtual ground lines VG34 and VG36 is to be selected and to be connected to a node between the drains of the transistors MA50 and MA60 by means of the transistors MA70 and MA71. Specifically, when the virtual ground control signal VG00 has an "H" level, the VG circuit 44 connects the main virtual ground line VG34 to the node between the drains of the transistors MA50 and MA60, and when the main virtual ground line VG02 has an "H" level, the transistor MA71 is turned on to connect main virtual ground line VG36 to the node between the drains of the transistors MA50 and MA60.

Likewise, the VG circuit 44 performs control as to which one of the main virtual ground lines VG35 and VG37 is to be selected and to be connected to a node between the drains of the transistors MA51 and MA61 by means of the transistors MA71 and MA73. Specifically, when the virtual ground control signal VG01 has an "H" level, the VG circuit 44 connects the main virtual ground line VG35 to the node between the drains of the transistors MA51 and MA61, and when the main virtual ground line VG03 has an "H" level, the transistor MA73 is turned on to connect main virtual ground line VG37 to the node between the drains of the transistors MA51 and MA61.

The VG circuit 44 performs similar control with respect to main virtual ground lines VG30 to VG33 that are controlled by the block B3. Specifically, when the virtual ground control signal VG00 has an "H" level, the transistor in the block B3 of the VG circuit 44 that corresponds to the transistor MA70 is turned on to connect the main virtual ground line VG30 to the PG circuit 46, and when the virtual ground control signal VG02 has an "H" level, the transistor in the block B3 of the VG circuit 44 that corresponds to the transistor MA73 is turned on to connect the main virtual ground line VG32 to the PG circuit 46.

When the virtual ground control signal VG01 has an "H" level, the transistor in the block B3 of the VG circuit 44 that corresponds to the transistor MA71 is turned on to connect the main virtual ground line VG31 to the PG circuit 46, and when the virtual ground control signal VG03 has an "H" level, the transistor in the block B3 of the VG circuit 44 that corresponds to the transistor MA73 is turned on to connect the main virtual ground line VG33 to the PG circuit 46.

The VG circuit 45 comprises n channel MOS transistors MB70, MB71, MB72 and MB73 and a block B4 which comprises transistors corresponding to and similar in structure to the transistors MB70, MB71, MB72 and MB73.

The VG circuit 45 performs control as to which one of the main virtual ground lines VG40 and VG42 is to be selected and to be connected to a node between the drains of the transistors MB50 and MB60 by means of the transistors MB70 and MB71. Specifically, when the virtual ground control signal VG00 has an "H" level, the VG circuit 45 connects the main virtual ground line VG40 to the node between the drains of the transistors MB50 and MB60, and when the main virtual ground line VG02 has an "H" level, the transistor MB71 is turned on to connect main virtual ground line VG42 to the node between the drains of the transistors MB50 and MB60.

Likewise, the VG circuit 45 performs control as to which one of the main virtual ground lines VG41 and VG43 is to be selected and to be connected to a node between the drains of the transistors MB51 and MB61 by means of the transistors MB71 and MB73. Specifically, when the virtual ground control signal VG01 has an "H" level, the VG circuit 45 connects the main virtual ground line VG41 to the node between the drains of the transistors MB51 and MB61, and when the main virtual ground line VG03 has an "H" level, the transistor MB73 is turned on to connect main virtual ground line VG43 to the node between the drains of the transistors MB51 and MB61.

The VG circuit 45 performs similar control with respect to main virtual ground lines VG44 to VG47 that are controlled by the block B4. Specifically, when the virtual ground control signal VG00 has an "H" level, the transistor in the block B4 of the VG circuit 45 that corresponds to the transistor MB70 is turned on to connect the main virtual ground line VG44 to the PG circuit 47, and when the virtual ground control signal VG02 has an "H" level, the transistor in the block B4 of the VG circuit 45 that corresponds to the transistor MB73 is turned on to connect the main virtual ground line VG46 to the PG circuit 47.

When the virtual ground control signal VG01 has an "H" level, the transistor in the block B4 of the VG circuit 45 that corresponds to the transistor MB71 is turned on to connect the main virtual ground line VG45 to the PG circuit 47, and when the virtual ground control signal VG03 has an "H" level, the transistor in the block B4 of the VG circuit 45 that corresponds to the transistor MB73 is turned on to connect the main virtual ground line VG47 to the PG circuit 47.

The circuit 54 comprises an n channel MOS transistor M80.

When the virtual ground control signal VG00 has an "H" level, the transistor M80 in the circuit 54 is turned on to connect the main virtual ground line VGD to a node between the drains of the transistors M81 and M82.

The above-described structure of this embodiment performs control as to which main bit line is to be connected to the associated sense amplifier, or which main bit line is to be set in an open state (where that main bit line is not connected to any of the ground line, the voltage supply or the current source), or which main bit line is to be precharged to a predetermined precharge potential (e.g., the same potential as the main bit line that is connected to the sense amplifier).

Likewise, the structure of this embodiment performs control as to which main virtual ground line is to be connected to the ground line GND, or which main virtual ground line is to be set in an open state, or which main virtual ground line is to be precharged to a predetermined precharge potential.

Figure 10:
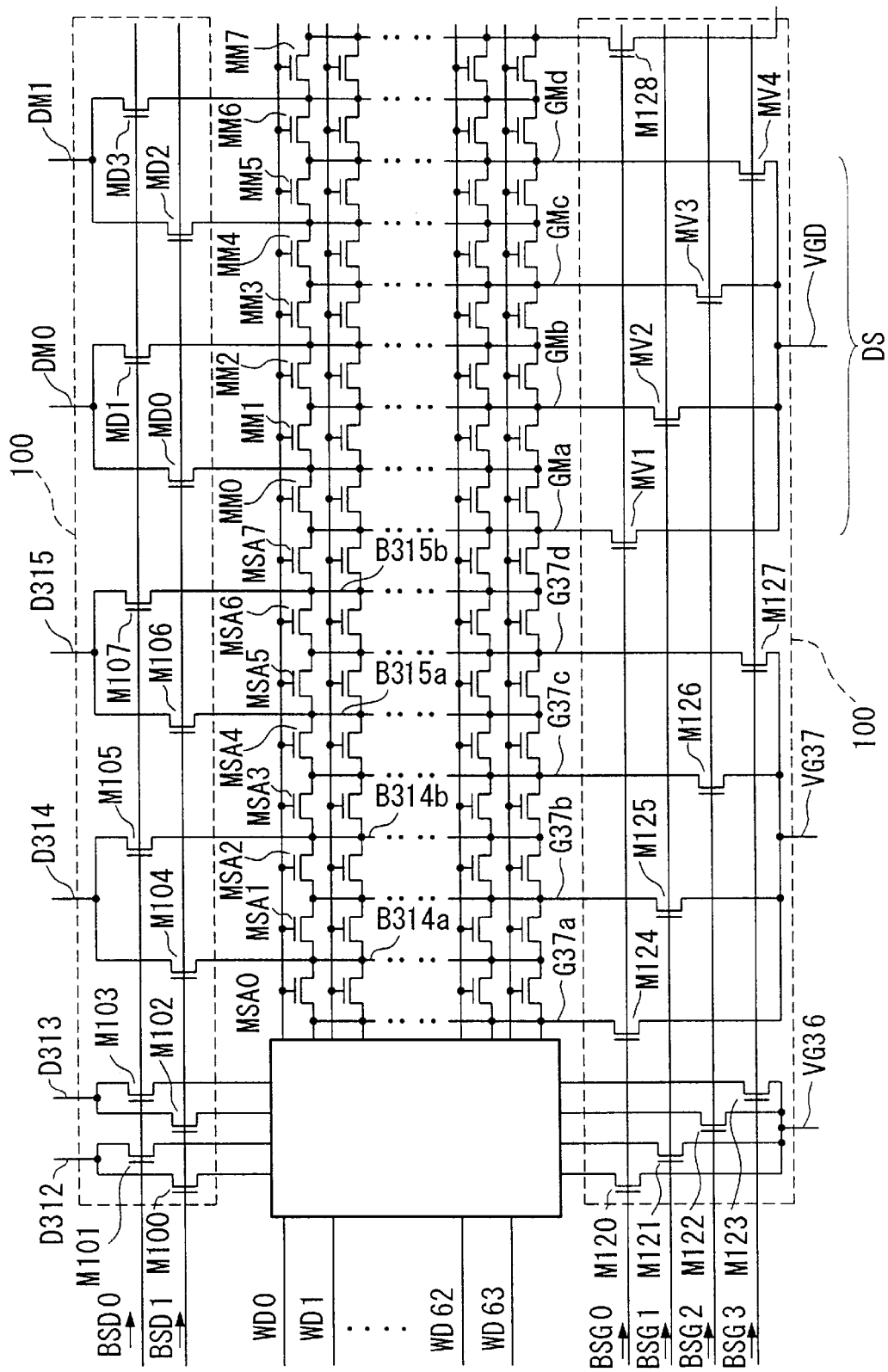
FIG. 10 is a block diagram showing the structures of memory-cell transistors of an area Q in FIG. 6, i.e., the structures of word lines WD0 to WD63 around a single cell bank.
Figure 11:
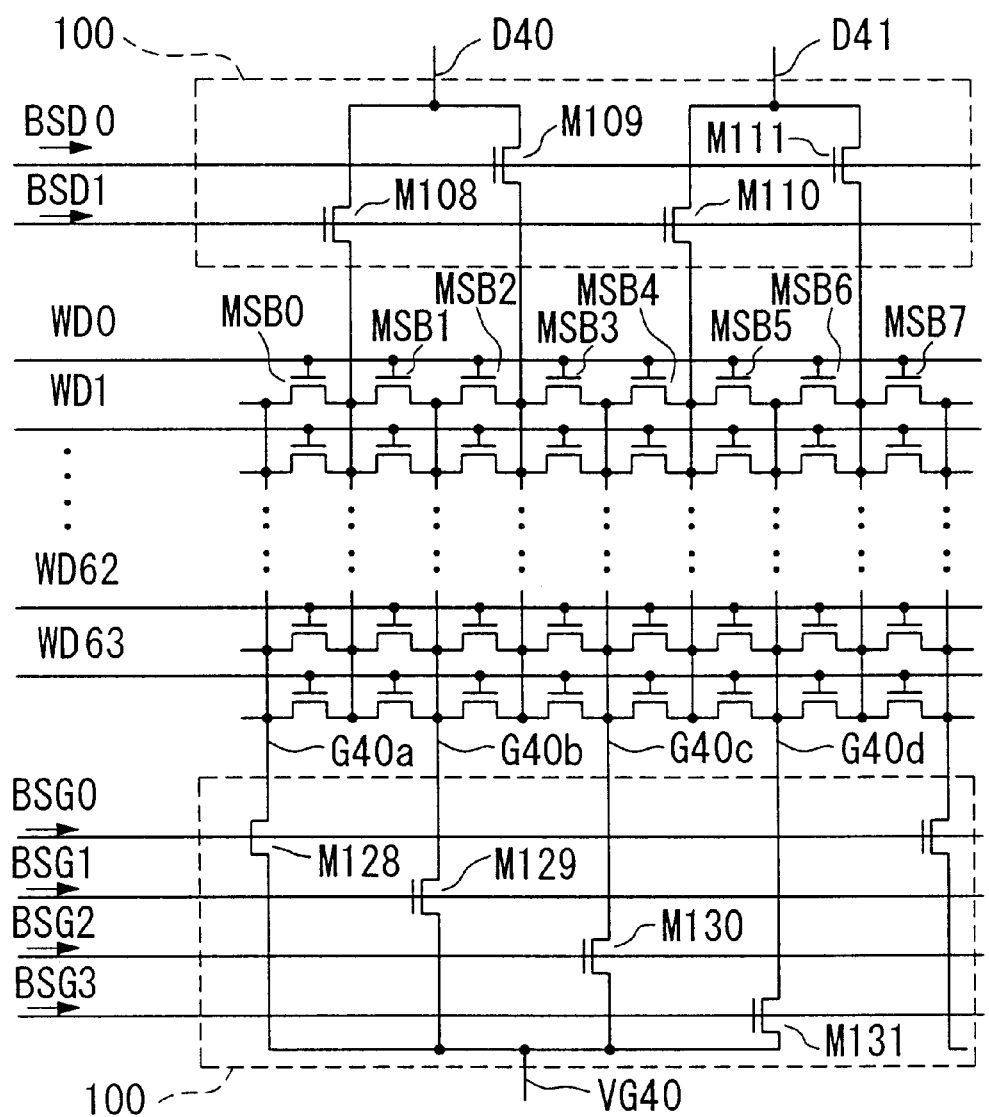
FIG. 11 is a block diagram showing the structures of memory-cell transistors of the area Q in FIG. 6 or the structures of the word lines WD0 to WD63 around a single cell bank.
Figure 12:
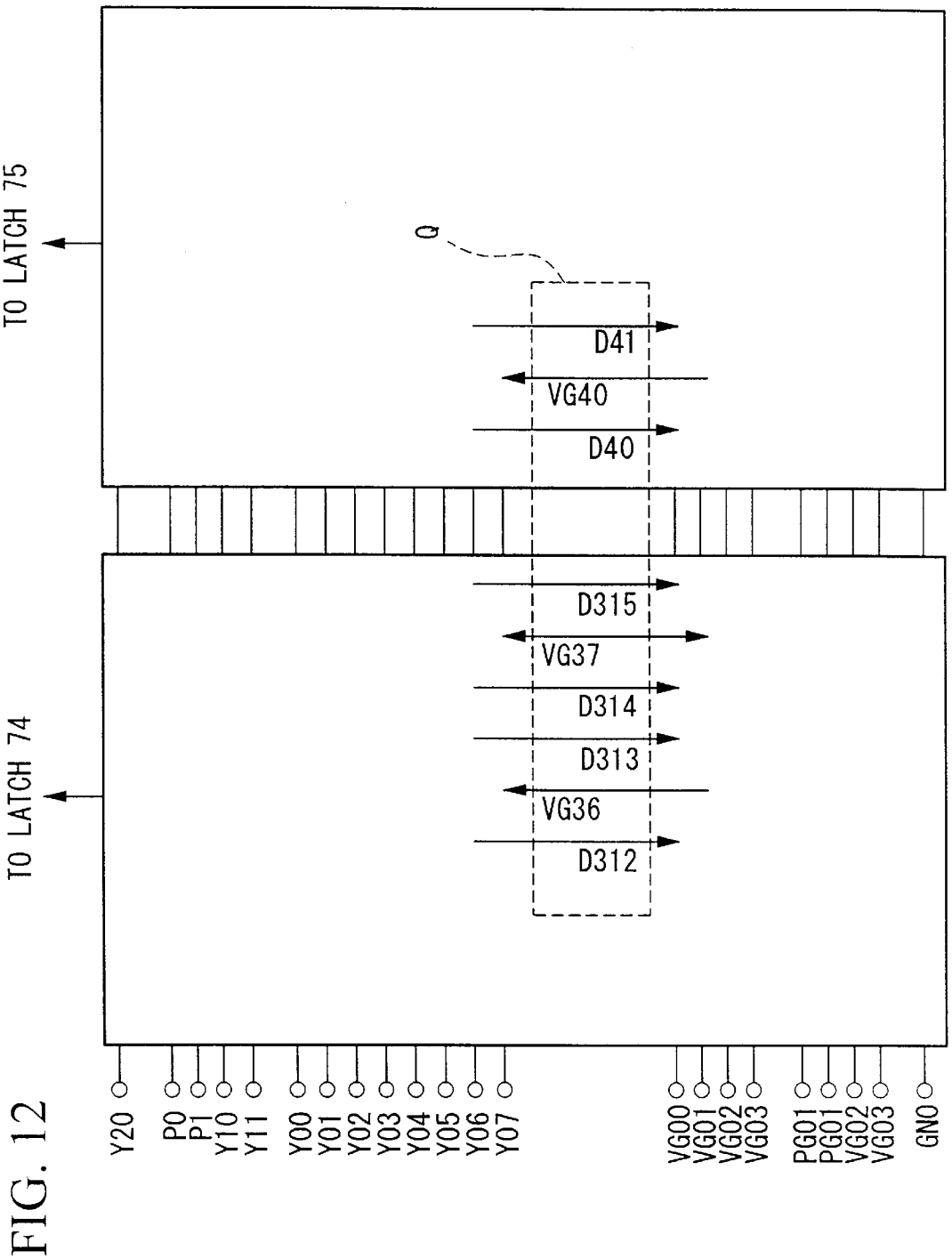
FIG. 12 is a conceptual diagram showing the relationship between a block BK4 which is an extracted portion of the precharge circuit 27A, VG selector 26A, cell plate 16A0, Y selector section 40A and Y2 selector section 50 that correspond to the sense amplifier SA3 in FIG. 3 and a block BK5 which is an extracted portion of the precharge circuit 27A, VG selector 26A, cell plate 16A0, Y selector section 40A and Y2 selector section 50 that correspond to the sense amplifier SA4.
Figure 13:
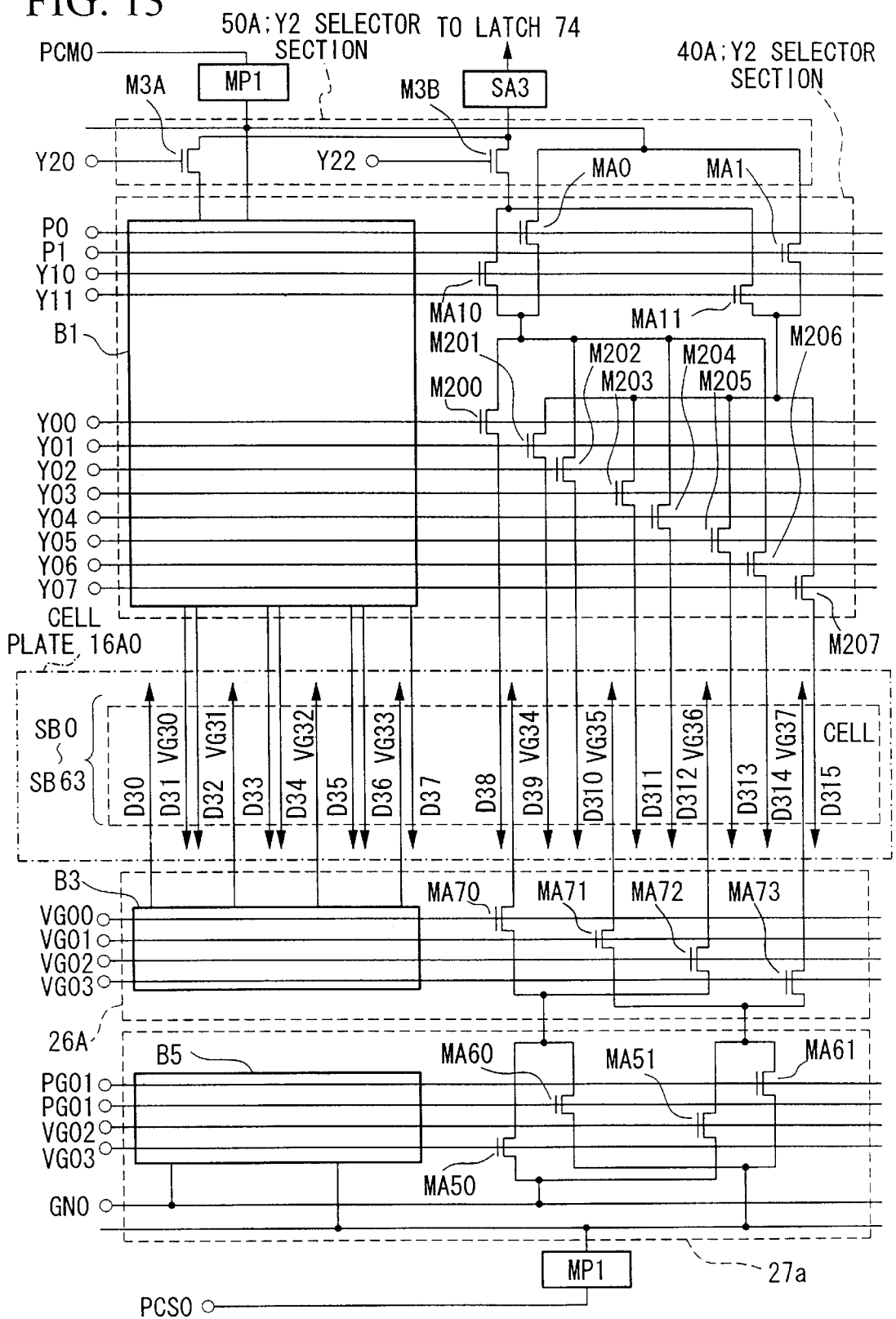
FIG. 13 is a block diagram showing the structure of the block BK4 in FIG. 12.
Figure 14:
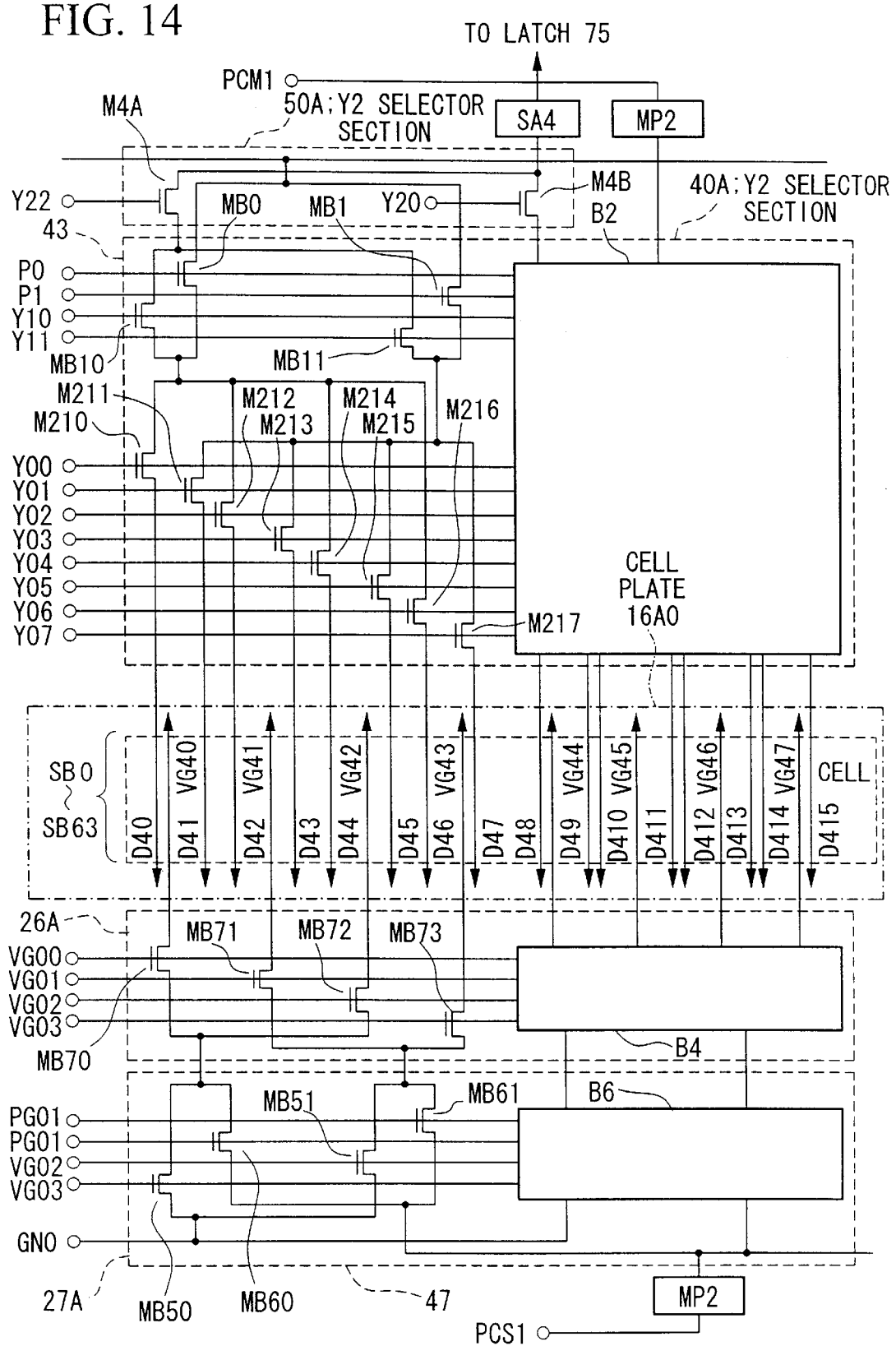
FIG. 14 is a block diagram showing the structure of the block BK5 in FIG. 12.
Figure 15:
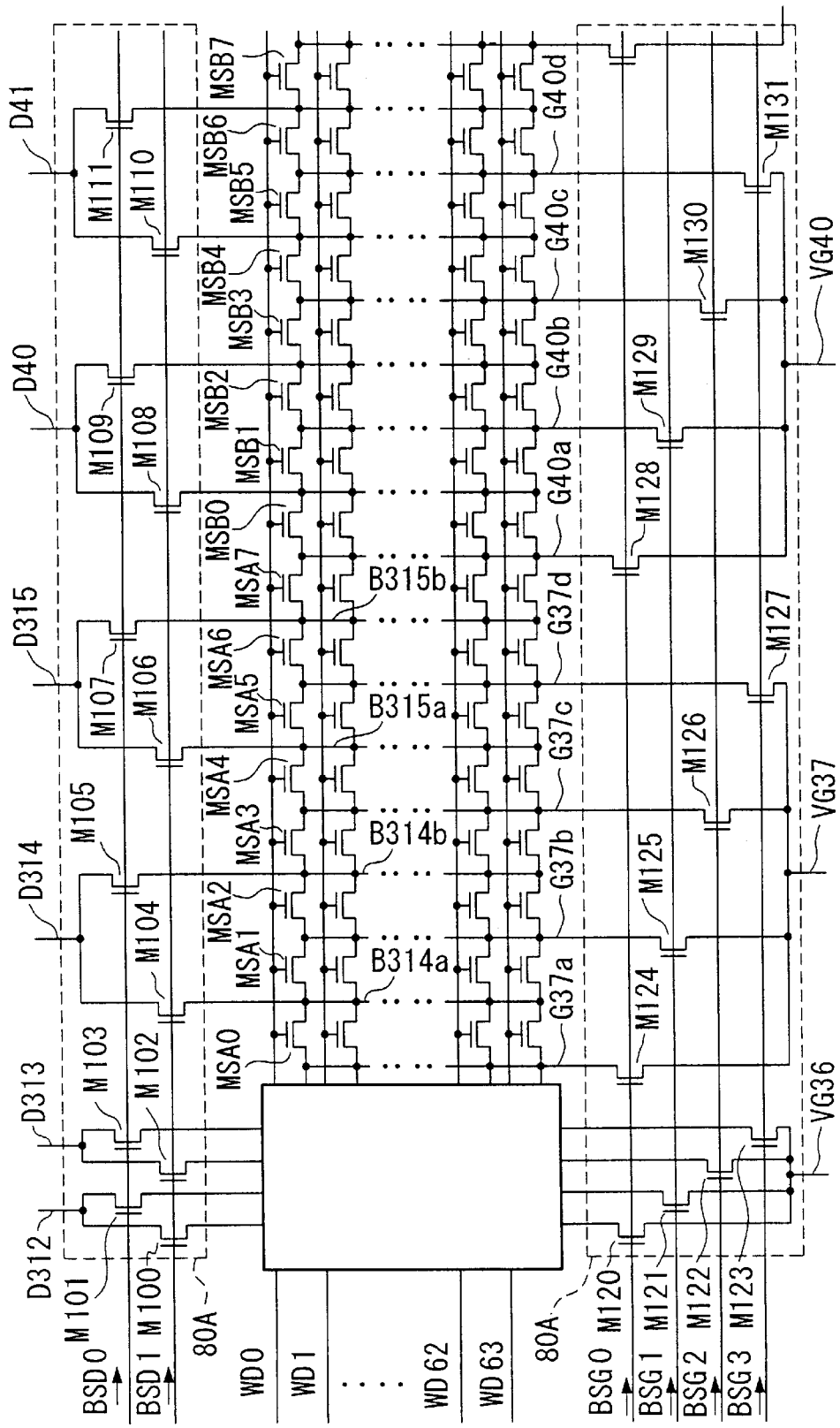
FIG. 15 is a block diagram showing the structures of the word lines WD0 to WD63 in the word lines WD0–WD4095, around a single cell bank, in the cell plate 16A0 which is extracted from the area Q in FIG. 12.

Referring now to FIGS. 10 and 11, a description will be given of how the memory-cell transistors are connected to the sub bit lines or sub virtual ground lines. FIGS. 10 and 11 are conceptual diagrams showing the structures of memory-cell transistors of an area Q in FIG. 6.

Specifically, FIGS. 10 and 11 show the structure of the memory cell area (e.g., one portion of the cell bank SB0) which corresponds to the main virtual ground lines VG36, VG37, VGD and VG40, the main bit lines D312, D313, D314, D315, DM0, DM1, D40 and D41 in FIGS. 7, 8 and 9.

FIGS. 10 and 11 also show the structures of the dummy cell area DS shown in FIG. 5 and memory cells formed by the memory-cell transistors of some portions of the cell bank SB0 that sandwich the dummy cell area DS (the memory cell portion corresponding to the main virtual ground lines VG36 and VG37 and the memory cell portion corresponding to the main virtual ground line VG40). An area C2 in FIG. 10 is formed by memory-cell transistors similar to memory-cell transistors MSA0 to MSA7.

In FIGS. 10 and 11, the thee are 64 word lines in each cell bank; for example, the cell bank SB0 has the word lines WD0–WD63. The dummy cell area DS is intervened between cell banks 55 (SB0) and 56 (SB0). The gates of the memory-cell transistors including this dummy cell area DS are connected to the associated word lines.

The diffusion layers of the memory-cell transistors on both sides are formed commonly.

For example, the diffusion layers of those memory-cell transistors whose gates are connected to the word line WD0 of the entire memory cell area 16 including the memory-cell transistors MSA0–MSA7, MM0–MM7 and MSB0–MSB7 are formed common to the diffusion layers of the adjoining memory-cell transistors. The other cell banks SB1 to SB63 have the same structures as that of the cell bank SB0. A bank selector 100 takes the structure of a single decoder which is the combination of the upper and lower portions in FIGS. 10 and 11, and is provided common to the horizontal cell banks in FIG. 5. That is, the bank selector 100 is provided for the individual cell banks SB0 of the sense amplifiers SA0–SA7 (FIG. 5) of each of the output terminals TO0–TO31 in FIGS. 1 and 2, or a single bank selector 100 is the collection of the whole horizontal cell banks SB0 including the dummy cell area DS in the memory cell area 16.

The structure of the upper portion of the bank selector 100 in FIGS. 10 and 11 comprises n channel MOS transistors M100 to M111, MD0 to MD3 and non-illustrated transistors that are connected to individual sub bit lines, and performs control as to which one of the sub bit lines is to be connected to the associated main bit line.

In the cell bank SB0 (55; see FIG. 5), for example, based on the select signals BSD0 and BSD1, the bank selector 100 performs control as to which one of a sub bit line B314a connected to the common portion of the diffusion layers of the memory-cell transistors MSA0 and MSA1 and a sub bit line B314b connected to the common portion of the diffusion layers of the memory-cell transistors MSA2 and MSA3 is to be connected to the main bit line D314.

Specifically, when the select signal BSD0 having an "H" level is input in the cell bank SB0 (55; see FIG. 5), the transistor M105 in the bank selector 100 is turned on, thus connecting the sub bit line B314b to the main bit line D314.

Likewise, when the select signal BSD1 having an "H" level is input in the cell bank 55, the transistor M104 in the bank selector 100 is turned on, thus connecting the sub bit line B314a to the main bit line D314.

Further, in the cell bank SB0 (55; see FIG. 5), based on the select signals BSD0 and BSD1, the bank selector 100 performs control as to which one of a sub bit line B315a connected to the common portion of the diffusion layers of the memory-cell transistors MSA4 and MSA5 and a sub bit line B315b connected to the common portion of the diffusion layers of the memory-cell transistors MSA6 and MSA7 is to be connected to the main bit line D315.

Specifically, when the select signal BSD0 having an "H" level is input in the cell bank SB0 (55; see FIG. 5), the transistor M107 in the bank selector 100 is turned on, thus connecting the sub bit line B315b to the main bit line D315.

Likewise, when the select signal BSD1 having an "H" level is input in the cell bank 55, the transistor M104 in the bank selector 100 is turned on, thus connecting the sub bit line B315a to the main bit line D315.

Similarly, in the cell bank SB0 (56; see FIG. 5), based on the select signals BSD0 and BSD1, the bank selector 100 controls the connection of sub bit lines B40a and B40b to the main bit line D40 via the respective transistors M108 and M109 and controls the connection of sub bit lines B41a and B41b to the main bit line D41 via the respective transistors M110 and M111, based on the select signals BSD0 and BSD1.

The threshold values of the transistors MD0 to MD3 of the dummy cell area DS in the bank selector 100 are controlled to be high. That is, the threshold values of the transistors MD0 to MD3 of the dummy cell area DS are controlled to such values that those transistors are not turned on by the voltage values of the H-level select signals BSD0 and BSD1 that are applied to their gates. The threshold values of the other unillustrated transistors that constitute the bank selector 100 of the dummy cell area DS intervened between cell banks are likewise controlled to such values that those transistors are not turned on by the voltage values of the select signals BSD0 and BSD1.

The structure of the lower portion of the bank selector 100 in FIG. 10 comprises n channel MOS transistors M120 to M131, MV0 to MV4 and unillustrated transistors that are connected to individual sub bit lines, and performs control as to which one of the sub virtual ground lines is to be connected to the associated main virtual ground line.

In the cell bank 55, for example, based on select signals BSG0 to BSG3, the bank selector 100 performs control as to which one of a sub virtual ground line G37a connected to the common portion of the diffusion layers of the memory-cell transistor MSA0 and the adjacent memory-cell transistor to the left of the transistor MSA0, a sub virtual ground line G37b connected to the common portion of the diffusion layers of the memory-cell transistors MSA1 and MSA2, a sub virtual ground line G37c connected to the common portion of the diffusion layers of the memory-cell transistors MSA3 and MSA4, and a sub virtual ground line G37d connected to the common portion of the diffusion layers of the memory-cell transistors MSA5 and MSA6 is to be connected to the main virtual ground line VG37.

Specifically, when the select signal BSG0 having an "H" level is input in the cell bank 55, the transistor M124 in the bank selector 100 is turned on, thus connecting the sub virtual ground line G37a to the main virtual ground line VG37.

Likewise, when the select signal BSG1 having an "H" level is input in the cell bank 55, the transistor M125 in the bank selector 100 is turned on, thus connecting the sub virtual ground line G37b to the main virtual ground line VG37.

When the select signal BSG2 having an "H" level is input in the cell bank 55, the transistor M126 in the bank selector 100 is turned on, thus connecting the sub virtual ground line G37c to the main virtual ground line VG37.

Further, when the select signal BSG3 having an "H" level is input in the cell bank 55, the transistor M127 in the bank selector 100 is turned on, thus connecting the sub virtual ground line G37d to the main virtual ground line VG37.

Next, in the cell bank 55, based on the select signals BSG0 to BSG3, the bank selector 100 performs control as to which one of a sub virtual ground line G40a connected to the common portion of the diffusion layers of the memory-cell transistor MM7 and the adjacent memory-cell transistor to the left of the transistor MM7, a sub virtual ground line G40b connected to the common portion of the diffusion layers of the memory-cell transistors MSBl and MSB2, a sub virtual ground line G40c connected to the common portion of the diffusion layers of the memory-cell transistors MSB3 and MSB4, and a sub virtual ground line G40d connected to the common portion of the diffusion layers of the memory-cell transistors MSB5 and MSB6 is to be connected to the main virtual ground line VG40.

Specifically, when the select signal BSG0 having an "H" level is input in the cell bank 56, the transistor M128 in the bank selector 100 is turned on, thus connecting the sub virtual ground line G40a to the main virtual ground line VG40.

Likewise, when the select signal BSG1 having an "H" level is input in the cell bank 56, the transistor M129 in the bank selector 100 is turned on, thus connecting the sub virtual ground line G40b to the main virtual ground line VG40.

When the select signal BSG2 having an "H" level is input in the cell bank 56, the transistor M130 in the bank selector 100 is turned on, thus connecting the sub virtual ground line G40c to the main virtual ground line VG40.

Further, when the select signal BSG3 having an "H" level is input in the cell bank 56, the transistor M131 in the bank selector 100 is turned on, thus connecting the sub virtual ground line G40d to the main virtual ground line VG40.

The unillustrated other cell banks in the memory cell area have the same structures.

The threshold values of the transistors MV2 to MV4 of the dummy cell area DS in the bank selector 100 are controlled to be high. That is, the threshold values of the transistors MV2 to MV4 of the dummy cell area DS are controlled to such values that those transistors are not turned on by the voltage values of the select signals BSG1, BSG2 and BSG3 that are applied to their gates.

The threshold value of the transistor MV1 alone is controlled to a value similar to that of the transistors that are used in the other logic circuits. That is, when a select signal GSG0 has an "H" level the transistor MV1 is turned on to connect a sub virtual ground line GMa to the main virtual ground line VGD.

To read data from the memory-cell transistor MSA7, the main bit line D315 is connected to the sense amplifier SA3 and the main virtual ground line VGD is connected to the ground line GND. Therefore, the threshold value of only the transistor MV1 is controlled to such a value that the transistor MV1 is turned on by the "H" level of the control signal in order to connect the main virtual ground line VGD to the sub virtual ground line GMa so that the diffusion layer of the memory-cell transistor MSA7 is set to the ground potential via the sub virtual ground line GMa.

The threshold values of unillustrated transistors that constitute the bank selector 100 in the dummy cell area DS intervened between cell banks at the interface where the burst lengths of the other output terminals TO1–TO31 are likewise controlled to such values that those transistors are not turned on by the voltage values of the select signals BSG1, BSG2 and BSG3.

Only those transistors in the other dummy cell areas DS which correspond to the transistor MV1 are turned on when the select signal BSG0 has an "H" level, thus connecting the associated sub virtual ground lines to the associated main virtual ground lines.

The threshold values of all the transistors in the dummy cell area DS are controlled to be high. That is, the threshold values of all the memory-cell transistors in the dummy cell area DS are controlled to such values that those transistors are formed in a data-written state and are not turned on by the read voltage that is applied to their gates.

For example, even if the read voltage is applied to the word line WD0, the memory-cell transistors MM0–MM7 are not turned on. Even if an arbitrary voltage is applied to the common diffusion layer of the memory-cell transistors MSA7 and MM0 and the common diffusion layer of the memory-cell transistors MM7 and MSB0 are grounded, therefore, no current flows in the memory-cell transistors MM0–MM7.

Referring now to FIGS. 1 to 3 and 5 to 11, a description will be given of an example of the operation of reading stored data from the memory-cell transistors in the semiconductor memory device according to this embodiment. Although the following description will explain the operation of the portion in the memory cell area 16 that corresponds to the output terminal TO0 (a half of the cell plate 160), the same operation should apply to the other output terminals TO1 to TO31.

<Operation with Burst Length of 8 Bits>

The semiconductor memory device according to this embodiment sets the burst length first. To set the burst length to 8 bits, the following process is performed. To enable the semiconductor memory device, the control signal CASB is set to an "L" level after which the control signal RASB, the control signal CASB and the control signal MRB are set to an "L" level, and the address signals AD0 and AD1 are set to an "L" level. Since the burst length is set at this time, it does not matter whether the other address signals AD2 to AD12 have an "H" level or "L" level.

As a result, the address signal AD0 input from an external unit (computer or the like) via the address buffer 11 is written in the address latch 12 as the row address signals AD0AT and AD1AT at the timing at which the write signal RW is input from the instruction decoder 28. The row address signals AD0AT and AD1AT are respectively sent as an L-level signal and H-level signal to the switch circuit 14 from the address latch 12.

Because the row address signal AD0AT has the "L" level and the row address signal AD1AT has the "H" level, the switch circuit 14 sets the burst length to 8 bits at the timing at which the control signal MRSB2 is input from the instruction decoder 28 and outputs the control signal MDBL8 having an "H" level.

Suppose that data stored in the memory-cell transistor MSA0 is then selected as data to be read to the sense amplifier SA3.

At this time, the address signals AD0–AD12 input from the external unit are stored in the address latch 12 via the address buffer 11 as the row address signals AD0AT–AD12AT for the row address to select a word line at the timing when the control signal CSB becomes an "L" level and control signal RASB becomes an "L" level.

Next, the address signals AD0–AD7 input from the external unit are stored in the address latch 12 via the address buffer 11 as the column address signals AD0RT–AD7RT for the column address to select a bit line at the timing when the control signal CSB becomes an "L" level and control signal CASB becomes an "L" level.

Accordingly, the X decoder 13 selects and enables the word line WD0 based on the values of the row address signals AD1AT–AD12AT to thereby apply a predetermined read voltage to the gates of the memoiy-cell transistors MSA0–MSA7, MM0–MM7 and MSB0–MSB7.

Data is stored in each of the aforementioned memory-cell transistors by changing the threshold voltage that controls the ON/OFF action of that transistor. That is, when each memory-cell transistor is turned on as the word line that is connected to the gate of that memory-cell transistor is enabled by changing the threshold voltage, the current that corresponding to the threshold voltage flows through the memory-cell transistor, thus causing the transistor to store data. In the case of binary data, two threshold values respectively for the state where the current is hard to flow (data of "1") and the state where the current is easy to flow (data of "0") are to be controlled. The state of easy flow indicates that the memory-cell transistor is turned on by the predetermined read voltage.

As the control signal MDBL8 has the "H" level, the delay circuit 31 outputs precharge signals PCM20, PCM21, PCS20 and PCS21 as delayed signals of the control signal RASB regardless of the column address signal AD2RT. As a result, the precharge circuits MP1, MP2, SP1 and SP2 are enabled and output predetermined precharge voltages.

Next, data is read out from each cell bank SB0 for each of the sense amplifiers of the output terminals TO0–TO31 of the memory cell area 16. That is, to permit the read current from the main bit line D314 to flow only through the memory-cell transistor MSA0 to be selected, therefore, it is necessary to set the main bit line D313 in an open state (high-impedance state), the main virtual ground line VG37 at the ground potential (GND level), the main bit line D315 at a predetermined potential (precharge potential), and the main virtual ground line VGD at the precharge potential.

Since the threshold voltages of the memory-cell transistors MM0–MM7 of the dummy cell area DS are equal to or greater than the predetermined read voltage at this time, no current flows in the memory-cell transistors MM0–MM7. It does not therefore matter whether the main bit line DM0 has the precharge potential or is in an open state. As the main bit line D315 has the precharge potential, however, the main virtual ground line VGD should have the precharge potential in order to prevent the flow-in of the current from the main bit line D315.

Based on the input column address signals AD2RT and AD3RT and because of the input control signal MDBL8 having the "H" level, the Y2 decoder 19 detects that the burst length is 8 bits, and sets the Y selector control signals Y20 and Y21 to an "1" level and sets the Y selector control signals Y22 and Y23 to an "H" level in order to read data on the main bit line D314 to the sense amplifier SA3 and read data on the main bit line D414 to the sense amplifier SA4.

This turns on the transistor M3B so that the group of the main bit lines D38–D315 including the main bit line D314 is selected.

Likewise, the transistor M4B is turned on so that the group of the main bit lines D48–D415 including the main bit line D414 is selected.

Because the dummy cell area DS electrically insulates the boundary between the memory-cell transistors of two sense amplifier groups which are obtained by separating the 8-bit sense amplifiers into two groups of 4-bit sense amplifiers, the group of the sense amplifiers SA0–SA3 and the group of the sense amplifiers SA4–SA7 operate quite independently. Therefore, the following description will be given only with respect to the sense amplifier SA3.

Unillustrated memory-cell transistors whose locations correspond to the location of the memory-cell transistor MSA0 are selected as holding data to be read out to the sense amplifiers SA0–SA2 and SA4–SA7, and data is output to the sense amplifiers SA0–SA2 and SA4–SA7 in a process similar to what will be explained below. The following will discuss the flow of data to be read out to the sense amplifier SA3.

Next, based on the input row address signal AD0AT and column address signals AD4RT, AD6RT and AD7RT, the Y decoder 17 outputs the L-level precharge signal P0 and Y selector control signal Y11 and the H-level precharge signal P1 and Y selector control signal Y10 to make the group of the main bit lines D38, D310, D312 and D314 connectable to the sense amplifier SA3 and make the group of the main bit lines D39, D311, D313 and D315 connectable to the precharge circuit MP1 so that the main bit lines D39, D311, D313 and D315 will have the precharge potential.

Consequently, the transistors MA10, MA1, MB10 and MB1 are turned on and the transistors MA11, MA0, MB1 and MB0 are turned off.

This makes the group of the main bit lines D38, D310, D312 and D314 connectable to the sense amplifier SA3 and makes the group of the main bit lines D39, D311, D313 and D315 connectable to the precharge circuit MP1.

Further, based on the input column address signal AD6RT, the Y decoder 17 sets the Y selector control signals Y00–Y05 to an "L" level and the Y selector control signals Y06 and Y07 to an "H" level to set the main bit line D313 in an open state, connect the main bit line D314 to the sense amplifier SA3 and set the main bit line D315 at the precharge potential.

Accordingly, the transistors M206, M207, M216 and M217 are turned on and the transistors M200–M205 and M210–M215 are turned off.

As a result, the main bit line D313 is set in an open state, the main bit line D314 is connected to the sense amplifier SA3 and the main bit line D315 is connected to the precharge circuit MP1.

Next, based on the column address signals AD4RT–AD7RT, the VGPG decoder 21 outputs the L-level virtual ground control signal VG10 and precharge control signal PG1 and the H-level virtual ground control signal VG11 and precharge control signal PG1 to make the group of the main virtual ground lines VG36 and VG38 and the main virtual ground line VGD connectable to the precharge circuit SP1 so that those virtual ground control signals will have the precharge potential and to make the group of the main virtual ground lines VG33 and VG37 connectable to the ground line GND.

Consequently, the transistors M82, MA51 and MA60 are turned on and the transistors MA50 and MA61 are turned off. This makes the group of the main virtual ground lines VG36 and VG38 and the main virtual ground line VGD connectable to the precharge circuit SP1 and makes the group of the main virtual ground lines VG35 and VG37 connectable to the ground line GND.

Then, based on the row address signal AD0AT and column address signals AD4RT–AD7RT, the VG decoder 15 outputs the H-level virtual ground control signals VG00 and VG03 and the L-level virtual ground control signals VG01 and VG02 in order to set the main virtual ground line VG36 in an open state, connect the main virtual ground line VG37 to the ground line GND and connect the main virtual ground line VGD to the precharge circuit SP1.

Accordingly, the transistors M80, MA70 and MA73 are turned on and the transistors MA71 and MA72 are turned off. As a result, the main virtual ground line VG36 is set in an open state, the main virtual ground line VG37 is connected to the ground line GND, and the main virtual ground line VGD is connected to the precharge circuit PS1.

To connect the sub virtual ground line G37a to the main virtual ground line VG37, connect the sub virtual ground line GMa to the main virtual ground line VGD, connect the sub virtual ground line B314a to the main bit line D314 and connect the sub virtual ground line B315a to the main bit line D315 so that the current from the sense amplifier SA3 is permitted to flow only in the memory-cell transistor MSA0, the bank decoder 20 outputs the L-level select signal BSD0, the H-level select signal BSD1, the H-level select signal BSG0 and the L-level select signals BSG1–BSG3.

As a result, the transistors M100, M102, M104, M106, M120, M124, MV1 and M128 are turned on, thus connecting the sub virtual ground line G37a to the main virtual ground line VG37, connecting the sub virtual ground line GMa to the main virtual ground line VGD, connecting the sub bit line B314a to the main bit line D314 and connecting the sub bit line B315a to the main bit line D315.

Because the threshold voltages of the transistors MD0 and MD2 are controlled higher than those of the other transistors in the logic circuit (higher than the voltage of a predetermined H-level signal) at this time, the transistors MD0 and MD2 will not be turned on even if the predetermined H-level signal is input to their gates. Therefore, the charge current is not supplied to the diffusion layers of the memory-cell transistors including the memory-cell transistors MM0–MM7 of the dummy cell area DS via the sub bit lines BM0a, BM0b, BM1a and BM1b, so that current consumption does not occur in the dummy cell area DS even when the main bit line DM0 or DM1 is set at the precharge potential.

Because the threshold voltages of the transistors MV2 to MV4 are likewise controlled higher than those of the other transistors in the logic circuit (higher than the voltage of the predetermined H-level signal) at this time, the transistors MD0 and MD2 will not be turned on even if the predetermined H-level signal is input to their gates. Therefore, the charge current is not supplied to the diffusion layers of the memory-cell transistors including the memory-cell transistors MM0–MM7 of the dummy cell area DS via sub virtual ground lines GMb, GMc and GMd, so that current consumption does not occur in the dummy cell area DS even when the main virtual ground line VGD is set at the precharge potential.

As a result of the above, the sub bit line B314a connected via the transistor M104 to the main bit line D314 connected to the sense amplifier SA3 and the sub virtual ground line G37a connected via the transistor M124 to the main virtual ground line VG37 connected to the ground line GND are connected to the memory-cell transistor MSA0, so that the current flows toward the main virtual ground line VG37 from the sense amplifier SA3 via the memory-cell transistor MSA0.

At this time, the sense amplifiers SA0–SA7 are enabled by the sense enable signals SAEB20 and SAEB21 input from the delay circuit 31, so that data can be determined. That is, at the time of reading data from the selected memory-cell transistor in the memory cell area 16, the delay circuit 31 outputs both the sense enable signals SAEB20 and SAEB21 to enable all the sense amplifiers SA0–SA7 because the burst length is 8 bits.

Then, the Y selector control signals Y20 and Y21 change their levels between the "H" level and the "L" level at the same timing and the Y selector control signals Y22 and Y23 also change their levels between the "H" level and the "L" level at the same timing. Because the control signal MDBL8 has the "H" level at this time, the Y2 decoder 19 controls the Y selector control signals Y20 and Y21 and the Y selector control signals Y22 and Y23 at the same time in order to permit 8 bits of data to be read into the sense amplifiers SA0–SA7.

The sense amplifier SA3 compares the value of the current that flows across the main bit line D314 with the current value of the reference signal RG input from the reference cell 35. When the value of the current flowing across the main bit line D314 is larger than the current value of the reference signal RG, for example, the threshold value is low and the memory-cell transistor is on, so that the current is flowing through the memory-cell transistor. Therefore, the sense amplifier SA3 determines that data stored in the memory-cell transistor is "L".

When the value of the current flowing across the main bit line D314 is smaller than the current value of the reference signal RG, on the other hand, the threshold value is high and the memory-cell transistor is off, so that the current is not flowing through the memory-cell transistor. Therefore, the sense amplifier SA3 determines that data stored in the memory-cell transistor is "H".

Even if the memory-cell transistors on the left-hand side of the memory-cell transistor MSA0 in FIG. 10 has a low threshold voltage and is in such a state where the current easily flows at this time, the associated main bit lines D312 and D313 and the main virtual ground line VG36 are in an open state so that the currents from the memory-cell transistors on the left side to the memory-cell transistor MSA0 do not adversely affect the current that flows across the sub virtual ground line G37a. That is, the amount of the current flowing toward the sub virtual ground line G37a via the memory-cell transistor MSA0 is inhibited from being restricted by the current that flows toward the sub virtual ground line G37a from the other memory-cell transistors on the left side to the memory-cell transistor MSA0, thus preventing erroneous reading.

Even if the memory-cell transistors MSA1–MSA7 on the right-hand side of the memory-cell transistor MSA0 have low threshold voltages and are in such a state where the current easily flows, the associated main bit line D315 and the main virtual ground line VGD are at the precharge potential. This can prevent the current from flowing toward the other memory-cell transistors, including the memory-cell transistors MSA1–MSA7, than the selected one. When the word line WD0 becomes an "H" level, the current does not flow to the cell bank 56 because of the threshold values of the memory-cell transistors of the dummy cell area DS being controlled to be high, even if the sub virtual ground line GMa is set at the precharge potential. This can reduce the current consumption that occurs as the current flows in the diffusion layers of the memory-cell transistors.

This can reduce the consumed current and prevent erroneous reading from occurring as the sense amplifier SA3 makes a similar decision to the one in the case where the current flows in the memory-cell transistor MSA0 because the current flows toward the other memory-cell transistors, including the memory-cell transistors MSA1–MSA7, than the selected one even though the current from the sense amplifier does not flow across the sub virtual ground line G337a when the threshold value of the memory-cell transistor MSA0 is high.

In the same manner as the sense amplifier SA3 has read out data from the memory-cell transistor MSA0, the other sense amplifiers SA0–SA2 and sense amplifiers SA4–SA7 read data from the memory-cell transistors that correspond to the memory-cell transistor MSA0. The sense amplifiers SA0–SA7 send the read data to the latches 71–78, respectively.

The latches 71–78 output the read data stored there to the burst selector 79. At the timing the data is sent to the burst selector 79, an enable signal that permits data reading is sent to the external unit. Then, as the external unit supplies the clock signal whose frequency corresponds to the read cycle and outputs the control signal CKE, the counter 18 starts the counting operation of counting the count value every time the clock signal CLKI is input.

Accordingly, the counter 18 starts counting from the set value of the column address signals AD0RT–AD2RT, changes its value every time the count value {count signal CT2, count signal CT1, count signal CT0} is counted, and sends the resultant value to the burst decoder 29.

Then, the burst decoder 29 decodes the input count value {count signal CT2, count signal CT1, count signal CT0} and sends the select signal {select signal BD7, select signal BD6, select signal BD5, select signal BD4, select signal BD3, select signal BD2, select signal BD1, select signal BD0} as the decoding result to the burst selector 79.

As a result, the burst selector 79 selects one of the latches 71–78 based on the input select signal {select signal BD7, select signal BD6, select signal BD5, select signal BD4, select signal BD3, select signal BD2, select signal BD1, select signal BD0} and sends data from the selected latch to the external unit via, for example, the output terminal TO0.

That is, every time the clock signal CLKI is input, the burst selector 79 changes the sequence of latch outputs in the direction from the latch 71 toward the latch 78 in accordance with the set initial count value {count signal CT2, count signal CT1, count signal CT0 } based on the values of the column address signals AD0RT–AD2RT, so that burst reading is carried out at the period of the input clock signal CLK.

<Operation with Burst Length of 4 Bits>

The semiconductor memory device according to this embodiment sets the burst length first. To set the burst length to 4 bits, the following process is performed. To enable the semiconductor memory device, the control signal CASB is set to an "L" level after which the control signal RASB, the control signal CASB and the control signal MRB are set to an "L" level, the address signal AD0 is set to an "H" level and the address signal AD1 is set to an "L" level. Since the burst length is set at this time, it does not matter whether the other address signals AD2 to AD12 have an "H" level or "L" level.

As a result, the address signal AD0 input from an external unit (computer or the like) via the address buffer 11 is written in the address latch 12 as the row address signals AD0AT and AD1AT at the timing at which the write signal RW is input from the instruction decoder 28. The row address signals AD0AT and AD1AT are respectively sent as an L-level signal and H-level signal to the switch circuit 14 from the address latch 12.

Because the row address signal AD0AT has the "H" level and the row address signal AD1AT has the "L" level, the switch circuit 14 sets the burst length to 4 bits at the timing at which the control signal MRSB2 is input from the instruction decoder 28 and outputs the control signal MDBL8 having an "L" level.

Suppose that data stored in the memory-cell transistor MSA0 is then selected as data to be read to the sense amplifier SA3.

At this time, the address signals AD0–AD12 input from the external unit are stored in the address latch 12 via the address buffer 11 as the row address signals AD0AT–AD12AT for the row address to select a word line at the timing when the control signal CSB becomes an "L" level and control signal RASB becomes an "L" level.

Next, the address signals AD0–AD7 input from the external unit are stored in the address latch 12 via the address buffer 11 as the column address signals AD0RT–AD7RT for the column address to select a bit line at the timing when the control signal CSB becomes an "L" level and control signal CASB becomes an level.

Accordingly, the X decoder 13 selects and enables the word line WD0 based on the values of the row address signals AD1AT–AD12AT to thereby apply a predetermined read voltage to the gates of the memory-cell transistors MSA0–MSA7, MM0–MM7 and MSB0–MSB7.

As the control signal MDBL8 has the "L" level, the delay circuit 31 outputs the precharge signals PCM20, PCM21, PCS20 and PCS21 based on the column address signal AD2RT.

That is, when the column address signal AD2RT has an "L" level, the delay circuit 31 outputs the precharge signals PCM20 and PCS20 and does not output the precharge signals PCM21 and PCS21 in order to perform burst reading of data from the memory-cell transistors that correspond to the sense amplifiers SA0–SA3.

At this time, the precharge circuits MP1 and SP1 are enabled by the input precharge signals PCM20 and PCS20 and output the precharge voltage of a predetermined voltage value.

As the precharge signals PCM21 and PCS21 are not input, the precharge circuits MP2 and SP2 are not enabled and do not output the precharge voltage of the predetermined voltage value.

When the column address signal AD2RT has an "H" level, on the other hand. the delay circuit 31 outputs the precharge signals PCM21 and PCS21 and does not output the precharge signals PCM20 and PCS20 in order to perform burst reading of data from the memory-cell transistors that correspond to the sense amplifiers SA4–SA7.

At this time, the precharge circuits MP2 and SP2 are enabled by the input precharge signals PCM21 and PCS21 and output the precharge voltage of the predetermined voltage value.

As the precharge signals PCM20 and PCS20 are not input, the precharge circuits MP1 and SP1 are not enabled and do not output the precharge voltage of the predetermined voltage value.

Next, data is read out from each associated cell bank SB0 for each of the sense amplifiers of the output terminals TO0–TO31 of the memory cell area 16, i.e., for each of the sense amplifiers SA0–SA3 when the column address signal AD2RT has the "L" level or for each of the sense amplifiers SA4–SA7 when the column address signal AD2RT has the "H" level. That is, to permit the read current from the main bit line D314 to flow only through the memory-cell transistor MSA0 to be selected, therefore, it is necessary to set the main bit line D313 in an open state (high-impedance state), the main virtual ground line VG37 at the ground potential (GND level), the main bit line D315 at a predetermined potential (precharge potential), and the main virtual ground line VG40 at the precharge potential.

The following description will be given on the assumption that the column address signal AD2RT has the "L" level.

Since the threshold voltages of the memory-cell transistors MM0–MM7 of the dummy cell area DS are set equal to or greater than the predetermined read voltage (data writing state) at this time, no current flows in the memory-cell transistors MM0–MM7. It does not therefore matter whether the main bit line DM0 has the precharge potential or is in an open state. As the main bit line D315 has the precharge potential, however, the main virtual ground line VGD should have the precharge potential in order to prevent the flow-in of the current from the main bit line D315.

Based on the input column address signals AD2RT and AD3RT and because of the input control signal MDBL8 having the "L" level, the Y2 decoder 19 detects that the burst length is 4 bits, and sets the Y selector control signals Y20, Y21 and Y23 to an "L" level and the Y selector control signal Y22 to an "H" level in order to read data on the main bit line D314 to the sense amplifier SA3 and read data on the main bit line D414 to the sense amplifier SA4.

This turns on the transistor M3B so that the group of the main bit lines D38–D315 including the main bit line D314 is selected.

Because the dummy cell area DS electrically insulates the boundary between the memory-cell transistors of two sense amplifier groups which are obtained by separating the 8-bit sense amplifiers into two groups of 4-bit sense amplifiers, the group of the sense amplifiers SA0–SA3 and the group of the sense amplifiers SA4–SA7 operate quite independently in reading data from the memory-cell transistors. Therefore, the precharge voltage is not needed for the memory-cell transistors that correspond to the sense amplifiers SA4–SA7 and the precharge circuits MP2 and SP2 are not enabled.

Unillustrated memory-cell transistors whose locations correspond to the location of the memory-cell transistor MSA0 are selected as holding data to be read out to the sense amplifiers SA0–SA3, and data is output to the sense amplifiers SA0–SA3 in a process similar to what will be explained below. The following will discuss the flow of data to be read out to the sense amplifier SA3.

Next, based on the input row address signal AD0AT and column address signals AD4RT, AD6RT and AD7RT, the Y decoder 17 outputs the L-level precharge signal P0 and Y selector control signal Y11 and the H-level precharge signal P1 and Y selector control signal Y10 to make the group of the main bit lines D38, D310, D312 and D314 connectable to the sense amplifier SA3 and make the group of the main bit lines D39, D311, D313 and D315 connectable to the precharge circuit MP1 so that the main bit lines D39, D311, D313 and D315 will have the precharge potential.

Consequently, the transistors MA10, MA1, MB10 and MB1 are turned on and the transistors MA11, MA0, MB11 and MB0 are turned off.

This makes the group of the main bit lines D38, D310, D312 and D314 connectable to the sense amplifier SA3 and makes the group of the main bit lines D39, D311, D313 and D315 connectable to the precharge circuit MP1.

Further, based on the input column address signal AD6RT, the Y decoder 17 sets the Y selector control signals Y00–Y05 to an "L" level and the Y selector control signals Y06 and Y07 to an "H" level to set the main bit line D313 in an open state, connect the main bit line D314 to the sense amplifier SA3 and set the main bit line D315 at the precharge potential.

Accordingly, the transistors M206, M207, M216 and M217 are turned on and the transistors M200–M205 and M210–M215 are turned off.

As a result, the main bit line D313 is set in an open state, the main bit line D314 is connected to the sense amplifier SA3 and the main bit line D315 is connected to the precharge circuit MP1.

Next, based on the column address signals AD4RT–AD7RT, the VGPG decoder 21 outputs the L-level virtual ground control signal VG10 and precharge control signal PG1 and the H-level virtual ground control signal VG11 and precharge control signal PG1 to make the group of the main virtual ground lines VG36 and VG38 and the main virtual ground line VGD connectable to the precharge circuit SP1 so that those virtual ground control signals will have the precharge potential and to make the group of the main virtual ground lines VG33 and VG37 connectable to the ground line GND.

Consequently, the transistors M82, MA51 and MA60 are turned on and the transistors MA50 and MA61 are turned off. This makes the group of the main virtual ground lines VG36 and VG38 and the main virtual ground line VGD connectable to the precharge circuit SP1 and makes the group of the main virtual ground lines VG35 and VG37 connectable to the ground line GND.

Then, based on the row address signal AD0AT and column address signals AD4RT–AD7RT, the VG decoder 15 outputs the H-level virtual ground control signals VG00 and VG03 and the L-level virtual ground control signals VG01 and VG02 in order to set the main virtual ground line VG36 in an open state, connect the main virtual ground line VG37 to the ground line GND and connect the main virtual ground line VGD to the precharge circuit SP1.

Accordingly, the transistors M80, MA70 and MA73 are turned on and the transistors MA71 and MA72 are turned off. As a result, the main virtual ground line VG36 is set in an open state, the main virtual ground line VG37 is connected to the ground line GND, and the main virtual ground line VGD is connected to the precharge circuit PS1.

To connect the sub virtual ground line G37a to the main virtual ground line VG37, connect the sub virtual ground line GMa to the main virtual ground line VGD, connect the sub virtual ground line B314a to the main bit line D314 and connect the sub virtual ground line B315a to the main bit line D315 so that the current from the sense amplifier SA3 is permitted to flow only in the memory-cell transistor MSA0, the bank decoder 20 outputs the L-level select signal BSD0, the H-level select signal BSD1, the H-level select signal BSG0 and the L-level select signals BSG1–BSG3.

As a result, the transistors M100, M102, M104, M106, M120, M124, MV1 and M128 are turned on, thus connecting the sub virtual ground line G37a to the main virtual ground line VG37, connecting the sub virtual ground line GMa to the main virtual ground line VGD, connecting the sub bit line B314a to the main bit line D314 and connecting the sub bit line B315a to the main bit line D315.

Because the threshold voltages of the transistors MD0 and MD2 are controlled higher than those of the other transistors in the logic circuit (higher than the voltage of a predetermined H-level signal) at this time, the transistors MD0 and MD2 will not be turned on even if the predetermined H-level signal is input to their gates. Therefore, the charge current is not supplied to the diffusion layers of the memory-cell transistors including the memory-cell transistors MM0–MM7 of the dummy cell area DS via the sub bit lines BM0a, BM0b, BM1a and BM1b, so that current consumption does not occur in the dummy cell area DS even when the main bit line DM0 or DM1 is set at the precharge potential.

Because the threshold voltages of the transistors MV2 to MV4 are likewise controlled higher than those of the other transistors in the logic circuit (higher than the voltage of the predetermined H-level signal) at this time, the transistors MD0 and MD2 will not be turned on even if the predetermined H-level signal is input to their gates. Therefore, the charge current is not supplied to the diffusion layers of the memory-cell transistors including the memory-cell transistors MM0–MM7 of the dummy cell area DS via sub virtual ground lines GMb, GMc and GMd, so that current consumption does not occur in the dummy cell area DS even when the main virtual ground line VGD is set at the precharge potential.

As a result of the above, the sub bit line B314a connected via the transistor M104 to the main bit line D314 connected to the sense amplifier SA3 and the sub virtual ground line G37a connected via the transistor M124 to the main virtual ground line VG37 connected to the ground line GND are connected to the memory-cell transistor MSA0, so that the current flows toward the main virtual ground line VG37 from the sense amplifier SA3 via the memory-cell transistor MSA0.

At this time, the sense amplifiers SA0–SA3 are enabled by the sense enable signal SAEB20 input from the delay circuit 31, so that data can be determined. That is, at the time of reading data from the selected memory-cell transistor in the memory cell area 16, the delay circuit 31 outputs the sense enable signal SAEB20 to enable the sense amplifiers SA0–SA7 or a half of the sense amplifiers SA0–SA7 because the burst length is 4 bits.

Then, the Y selector control signals Y20 and Y21 independently change their levels between the "H" level and the "L" level based on the level of the column address signal AD2RT and the Y selector control signals Y22 and Y23 likewise independently change their levels between the "H" level and the "L" level based on the level of the column address signal AD2RT. Because the control signal MDBL8 has the "L" level and the column address signal AD2RT has the "L" level at this time, the Y2 decoder 19 controls the Y selector control signal Y20 in such a way that the Y selector control signal Y20 has an "H" level in order to permit 4 bits of data to be read into the sense amplifiers SA0–SA3.

The sense amplifier SA3 compares the value of the current that flows across the main bit line D314 with the current value of the reference signal RG input from the reference cell 35. When the value of the current flowing across the main bit line D314 is larger than the current value of the reference signal RG, for example, the threshold value is low and the memory-cell transistor is on, so that the current is flowing through the memory-cell transistor. Therefore, the sense amplifier SA3 determines that data stored in the memory-cell transistor is "L".

When the value of the current flowing across the main bit line D314 is smaller than the current value of the reference signal RG, on the other hand, the threshold value is high and the memory-cell transistor is off, so that the current is not flowing through the memory-cell transistor. Therefore, the sense amplifier SA3 determines that data stored in the memory-cell transistor is "H".

Even if the memory-cell transistors on the left-hand side of the memory-cell transistor MSA0 in FIG. 10 has a low threshold voltage and is in such a state where the current easily flows at this time, the associated main bit lines D312 and D313 and the main virtual ground line VG36 are in an open state so that the currents from the memory-cell transistors on the left side to the memory-cell transistor MSA0 do not adversely affect the current that flows across the sub virtual ground line G37a. That is, the amount of the current flowing toward the sub virtual ground line G37a via the memory-cell transistor MSA0 is inhibited from being restricted by the current that flows toward the sub virtual ground line G37a from the other memory-cell transistors on the left side to the memory-cell transistor MSA0, thus preventing errorneous reading.

Even if the memory-cell transistors MSA1–MSA7 on the right-hand side of the memory-cell transistor MSA0 have low threshold voltages and are in such a state where the current easily flows, the associated main bit line D315 and the main virtual ground line VGD are at the precharge potential. This can prevent the current from flowing toward the other memory-cell transistors, including the memory-cell transistors MSA1–MSA7, than the selected one. When the word line WD0 becomes an "H" level, the current does not flow to the cell bank 56 because of the threshold values of the memory-cell transistors of the dummy cell area DS being controlled to be high, even if the sub virtual ground line GMa is set at the precharge potential. This can reduce the current consumption that occurs as the current flows in the diffusion layers of the memory-cell transistors.

This can reduce the consumed current and prevent erroneous reading from occurring as the sense amplifier SA3 makes a similar decision to the one in the case where the current flows in the memory-cell transistor MSA0 because the current flows toward the other memory-cell transistors, including the memory-cell transistors MSA1–MSA7, than the selected one even though the current from the sense amplifier does not flow across the sub virtual ground line G337a when the threshold value of the memory-cell transistor MSA0 is high.

In the same manner as the sense amplifier SA3 has read out data from the memory-cell transistor MSA0, the other sense amplifiers SA0–SA2 read data from the memory-cell transistors that correspond to the memory-cell transistor MSA0. The sense amplifiers SA0–SA3 send the read data to the latches 71–74, respectively.

The latches 71–74 output the read data stored there to the burst selector 79. At the timing the data is sent to the burst selector 79, an enable signal that permits data reading is sent to the external unit. Then, as the external unit supplies the clock signal whose frequency corresponds to the read cycle and outputs the control signal CKE, the counter 18 starts the counting operation of counting the count value every time the clock signal CLKI is input.

Accordingly, the counter 18 starts counting from the set value of the column address signals AD0RT–AD2RT, changes its value every time the count value {count signal CT2, count signal CT1, count signal CT0} is counted, and sends the resultant value to the burst decoder 29.

Then, the burst decoder 29 decodes the input count value {count signal CT2, count signal CT1, count signal CT0} and sends the select signal {select signal BD7, select signal BD6, select signal BD5, select signal BD4, select signal BD3, select signal BD2, select signal BD1, select signal BD0} as the decoding result to the burst selector 79.

As a result, the burst selector 79 selects one of the latches 71–78 based on the input select signal {select signal BD7, select signal BD6, select signal BD5, select signal BD4, select signal BD3, select signal BD2, select signal BD1, select signal BD0} and sends data from the selected latch to the external unit via, for example, the output terminal TO0.

That is, every time the clock signal CLKI is input, the burst selector 79 changes the sequence of latch outputs in the direction from the latch 71 toward the latch 74 in accordance with the set initial count value {count signal CT2, count signal CT1, count signal CT0} based on the values of the column address signals AD0RT–AD2RT, so that burst reading with the length of 4 bits is carried out at the period of the input clock signal CLK.

Although the foregoing description has been given of the reading operation when the burst length is 4 bits and the column address signal AD2RT has an "L" level, the same applies to the operation of reading data from the memory-cell transistors that correspond to the sense amplifiers SA4–SA7 when the column address signal AD2RT has an "H" level.

At this time, the sense amplifiers SA4–SA7 are enabled and the precharge circuits MP2 and SP2 are enabled to read data from the memory-cell transistors that correspond to the sense amplifiers SA4–SA7.

As described above, the voltage applying pattern to connect the main bit lines and the main virtual ground lines to the associated sense amplifiers, set those lines in the open state and set those lines at the precharge potential is the same between the case where the burst length is 4 bits and the case where the burst length is 8 bits. The following discusses the voltage applying pattern to achieve the connection of the main bit lines and the main virtual ground lines to the associated sense amplifiers, setting of those lines in the open state and setting of those lines at the precharge potential in the operation of reading data from the memory-cell transistors MSA1–MSA7.

The following also describes a combination of the main bit lines D313–D315 and the main virtual ground lines VG36, VG37 and VGD for reading data from the memory-cell transistors MSA1–MSA7 shown in FIG. 10, as discussed in the case of reading data from the memory-cell transistor MSA0. At this time, the threshold voltages of the transistors MD0–MD3are set higher than the "H" level of the select signals BSD0 and BSD1 which are control signals so that the transistors MD0–MD3 are not turned on. It does not therefore matter whether the main bit lines DM0 and DM1 are in an open state or set at the precharge potential.

The following discusses the case of reading stored data from the memory-cell transistor MSA1.

The Y decoder 17, Y2 decoder 19, VG decoder 15 and VGPG decoder 21 set the main bit line D313 at the precharge potential, connect the main bit line D314 to the sense amplifier SA3, connect the main virtual ground line VG37 to the ground line GND, set the main bit line D315 in an open state, set the main virtual ground line VGD in an open state, and set the main virtual ground line VG36 at the precharge potential.

Then, the bank decoder 20 controls the bank selector 100 in such a way that the memory-cell transistor MSA1 is sandwiched between the main bit line D314 and the main virtual ground line VG37.

The following discusses the case of reading stored data from the memory-cell transistor MSA2.

The Y decoder 17, Y2 decoder 19, VG decoder 15 and VGPG decoder 21 set the main bit line D313 in an open state, connect the main bit line D314 to the sense amplifier SA3, connect the main virtual ground line VG37 to the ground line GND, set the main bit line D315 at the precharge potential, and set the main virtual ground line VGD at the precharge potential.

Then, the bank decoder 20 controls the bank selector 100 in such a way that the memory-cell transistor MSA2 is sandwiched between the main bit line D314 and the main virtual ground line VG37.

The following discusses the case of reading stored data from the memory-cell transistor MSA3.

The Y decoder 17, Y2 decoder 19, VG decoder 15 and VGPG decoder 21 set the main bit line D313 at the precharge potential, connect the main bit line D314 to the sense amplifier SA3, connect the main virtual ground line VG37 to the ground line GND, set the main bit line D315 in an open state, set the main virtual ground line VGD in an open state, and set the main virtual ground line VG36 at the precharge potential.

Then, the bank decoder 20 controls the bank selector 100 in such a way that the memory-cell transistor MSA3 is sandwiched between the main bit line D314 and the main virtual ground line VG37.

The following discusses the case of reading stored data from the memory-cell transistor MSA4.

The Y decoder 17, Y2 decoder 19, VG decoder 15 and VGPG decoder 21 set the main bit line D313 in an open state, connect the main bit line D314 to the sense amplifier SA3, connect the main virtual ground line VG37 to the ground line GND, connect the main bit line D315 to the sense amplifier SA3, set the main virtual ground line VGD at the precharge potential and set main bit line DM0 at the precharge potential.

Then, the bank decoder 20 controls the bank selector 100 in such a way that the memory-cell transistor MSA4 is sandwiched between the main bit line D315 and the main virtual ground line VG37.

The following discusses the case of reading stored data from the memory-cell transistor MSA5.

The Y decoder 17, Y2 decoder 19, VG decoder 15 and VGPG decoder 21 set the main bit line D313 in an open state, set the main bit line D314 at the precharge potential, connect the main virtual ground line VG37 to the ground line GND, connect the main bit line D315 to the sense amplifier SA3, set the main virtual ground line VGD in an open state, and set the main virtual ground line VG36 at the precharge potential.

Then, the bank decoder 20 controls the bank selector 100 in such a way that the memory-cell transistor MSA5 is sandwiched between the main bit line D315 and the main virtual ground line VG37.

The following discusses the case of reading stored data from the memory-cell transistor MSA6.

The Y decoder 17, Y2 decoder 19, VG decoder 15 and VGPG decoder 21 set the main bit line D313 in an open state, connect the main bit line D314 to the sense amplifier SA3, connect the main virtual ground line VG37 to the ground line GND, connect the main bit line D315 to the sense amplifier SA3, set the main virtual ground line VGD at the precharge potential and set main bit line DM0 at the precharge potential.

Then, the bank decoder 20 controls the bank selector 100 in such a way that the memory-cell transistor MSA6 is sandwiched between the main bit line D315 and the main virtual ground line VG37.

The following discusses the case of reading stored data from the memory-cell transistor MSA7.

The Y decoder 17, Y2 decoder 19, VG decoder 15 and VGPG decoder 21 set the main bit line D313 at the precharge potential, set the main bit line D314 at the precharge potential, set the main virtual ground line VG37 at the precharge potential, connect the main bit line D315 to the sense amplifier SA3, and connect the main virtual ground line VGD to the ground line GND.

Then, the bank decoder 20 controls the bank selector 100 in such a way that the memory-cell transistor MSA7 is sandwiched between the main bit line D315 and the main virtual ground line VG37.

According to the semiconductor memory device of the embodiment of this invention, as apparent from the above, the dummy cell area DS for the memory-cell transistors whose threshold voltages are set high is provided at each boundary between predetermined units of memory-cell transistors at which the burst length is switched (memory-cell transistor areas corresponding to sense amplifier groups corresponding to the burst lengths) in the burst reading, so that it is possible to electrically insulate the boundary between the two sense amplifier groups whose boundary is where the burst length for the memory-cell transistors is to be switched. When the burst length is set short, e.g., when the 8-bit burst length of the sense amplifiers SA0–SA7 is changed to the 4-bit burst length of the sense amplifiers SA0–SA3, therefore, the current produced from the precharge voltage or coming from a sense amplifier does not flow to the area of the memory-cell transistors of the sense amplifiers SA4–SA7 from the area of the memory-cell transistors of the sense amplifiers SA0–SA3. Unlike the prior art, this embodiment does not require precharging of the memory-cell transistors corresponding to the sense amplifiers SA4–SA7, thus saving the consumed current otherwise needed in the precharging operation. This can thus reduce the overall current consumption in the reading operation.

According to the semiconductor memory device of this embodiment, the memory-cell transistors of the dummy cell area DS are formed in the same process and with the same device structure as the memory-cell transistors in the other cell banks SB0–SB63, and setting the threshold voltages of the memory-cell transistors of the dummy cell area DS high is carried out in a process similar to the process of writing data in the memory-cell transistors of the cell banks. This makes it unnecessary to use a special process in setting the threshold voltages of the memory-cell transistors of the dummy cell area DS and form a special device structure so that the dummy cell area DS can be easily inserted at the boundary between the memory-cell transistor areas at which the burst length is to be switched.

According to the semiconductor memory device of this embodiment, as shown in FIG. 10, the layout design of the semiconductor memory device can be made with the same structure as those of the other memory cell areas. This embodiment can therefore be adapted to software macro (the software-based scheme of constructing memory cell areas) that has been popular recently. Therefore, in designing a semiconductor memory device which reduces the consumed power by avoiding precharging of those memory cell areas that are not used at the time the burst length is changed, the semiconductor memory device can be easily inserted at the boundary between the memory-cell transistor areas at which the burst length is to be changed (between cell banks, e.g., between the cell banks 55 and 56) without particularly modifying the software that designs the semiconductor memory device.

Although one embodiment of this invention has been described in detail above, the specific structure is not limited to that of the above-described embodiment but may be modified in various other forms without departing from the spirit or scope of the invention.

Although the electric insulation between cell banks in the dummy cell area DS is accomplished by columns of memory-cell transistors including the memory-cell transistors MM0–MM7 according to this embodiment, it may also be accomplished by a column of memory-cell transistors including only the memory-cell transistor MM0. Of course, the threshold voltages of all the memory-cell transistors in the column of memory-cell transistors that includes only the memory-cell transistor MM0 are set higher than the read voltage.

In short, according to the semiconductor memory device of this embodiment, because a dummy cell block comprising other memory cells than normal memory cells is provided at each boundary between predetermined units of memory blocks of memory-cell transistors at which the burst length is switched in the burst reading, it is possible to electrically insulate two sense amplifier groups that sandwich the boundary. When the burst length is set short so that one memory cell block to one side of the dummy cell block will not be used, therefore, the current produced from the precharge voltage or coming from a sense amplifier does not flow to that memory cell block from the other memory cell block. Unlike the prior art, this embodiment does not require precharging of the memory cell block which is not to be used, thus contributing to the reduction of the overall current consumption in the reading operation.

What is claimed is:

1. A semiconductor memory device comprising:
   a plurality of first memory cells each located at an intersection of each of a plurality of word lines and an associated one of a plurality of bit lines and each having one end connected to said associated bit line;
   a plurality of memory cell blocks each comprising a predetermined number of first memory cells in said plurality of said first memory cells;
   dummy cell blocks, provided among said memory cell blocks, for electrically isolating those memory cell blocks which are located at both ends from each other, each of said dummy cell blocks comprising second memory cells;
   main bit lines each provided for each of said memory cell blocks and each of said dummy cellblocks and each connected to an associated one of said bit lines;
   a main-bit-line control section for performing such control as to apply a predetermined voltage to said main bit lines, connect said main bit lines to associated sense amplifiers or set said main bit lines in an open state based on an address signal;
   virtual ground lines connected to other terminals of said first memory cells and said second memory cells;
   main virtual ground lines each provided for each of said memory cell blocks and each of said dummy cell blocks and each connected to an associated one of said virtual ground lines; and
   a main-virtual-ground-line control section for performing such control as to apply a predetermined voltage to said main virtual ground lines or set said main virtual ground lines in an open state based on an address signal.

2. The semiconductor memory device according to claim 1, wherein said second memory cells constituting said dummy cell blocks are similar to said first memory cells in said memory cell blocks.

3. The semiconductor memory device according to claim 2, wherein each of said first memory cells is comprised of an MOS transistor and stores data as a threshold voltage for controlling an ON/OFF state of said transistor is changed.

4. The semiconductor memory device according to claims 3, wherein a threshold voltage of MOS transistors constituting said second memory cells of said dummy cell blocks are controlled to such a value that said MOS transistors are not turned on by a predetermined voltage to be applied to gates of said MOS transistors via said word lines.

5. The semiconductor memory device according to claim 1, wherein each of said bit lines is connected to an associated one of said main bit lines via a first MOS transistor and each of said virtual ground lines is connected to an associated one of said main virtual ground lines via a second MOS transistor.

6. The semiconductor memory device according to claim 5, wherein a threshold voltage of said first MOS transistors provided between said bit lines and said main bit lines in said dummy cell blocks is controlled to such a value that said first MOS transistors are not turned on by a voltage of a predetermined control signal.

7. The semiconductor memory device according to claim 5, wherein a threshold voltage of said second MOS transistors provided between said virtual ground lines and said main virtual ground lines in said dummy cell blocks is controlled to such a value that said second MOS transistors are not turned on by a voltage of a predetermined control signal.

8. The semiconductor memory device according to claim 5, further comprising a memory-cell selection control section for performing ON/OFF control of said first MOS transistors and said second MOS transistors based on an input address signal to thereby select a memory cell corresponding to said address signal and control a direction of a current flowing in said memory cell in association with voltage states of said main bit lines and said main virtual ground lines.

9. The semiconductor memory device according to claim 1, wherein interconnection patterns of said main bit lines and said main virtual ground lines are formed alternately.

* * * * *